United States Patent
Shimizu et al.

(10) Patent No.: US 9,410,245 B2
(45) Date of Patent: Aug. 9, 2016

(54) GAS-BARRIER PLASTIC MOLDED PRODUCT AND MANUFACTURING PROCESS THEREFOR

(75) Inventors: Mari Shimizu, Chuo-ku (JP); Eitaro Matsui, Chuo-ku (JP); Aiko Sato, Chuo-ku (JP); Masaki Nakaya, Chuo-ku (JP); Hiroyasu Tabuchi, Chuo-ku (JP)

(73) Assignee: KIRIN BEER KABUSHIKI KAISHA, Tokyo (JP)

( * ) Notice: Subject to any disclaimer, the term of this patent is extended or adjusted under 35 U.S.C. 154(b) by 574 days.

(21) Appl. No.: 13/996,229

(22) PCT Filed: Dec. 28, 2011

(86) PCT No.: PCT/JP2011/080408
§ 371 (c)(1),
(2), (4) Date: Aug. 6, 2013

(87) PCT Pub. No.: WO2012/091097
PCT Pub. Date: Jul. 5, 2012

(65) Prior Publication Data
US 2013/0316108 A1 Nov. 28, 2013

(30) Foreign Application Priority Data
Dec. 28, 2010 (JP) ................... 2010-293646

(51) Int. Cl.
*C23C 16/44* (2006.01)
*C23C 16/04* (2006.01)
(Continued)

(52) U.S. Cl.
CPC . *C23C 16/44* (2013.01); *B65D 1/40* (2013.01); *C23C 16/045* (2013.01); *C23C 16/401* (2013.01); *C23C 16/505* (2013.01); *Y10T 428/1352* (2015.01); *Y10T 428/269* (2015.01)

(58) Field of Classification Search
CPC .... C23C 16/44; C23C 16/045; C23C 16/401; C23C 16/505; Y10T 428/269; Y10T 428/1352; B65D 1/40
See application file for complete search history.

(56) References Cited

U.S. PATENT DOCUMENTS

| 5,204,141 A | 4/1993 | Roberts et al. |
| 6,589,619 B1 | 7/2003 | Nagashima |

(Continued)

FOREIGN PATENT DOCUMENTS

| EP | 1 884 472 A1 | 2/2008 |
| EP | 2 228 465 A1 | 9/2010 |

(Continued)

OTHER PUBLICATIONS

Office Action for Korean Application No. 10-2013-7019902 dated Jul. 24, 2014.

(Continued)

*Primary Examiner* — Michael C Miggins
(74) *Attorney, Agent, or Firm* — Sughrue Mion, PLLC

(57) ABSTRACT

A gas barrier plastic molded product having high gas barrier properties is provided. The gas barrier plastic molded product is a gas barrier plastic molded product comprising a plastic molded product and a gas barrier thin film provided on the surface of the plastic molded product, in which the gas barrier thin film contains silicon (Si), carbon (C), oxygen (O) and hydrogen (H) as constituent elements, and comprises a Si-containing layer having a Si content percentage represented by (Mathematical Formula 1) of 40.1% or more:

Si content percentage [%]={(Si content [atomic %])/ (total content of Si, O and C [atomic %])}×100    (Mathematical Formula 1)

wherein in Mathematical Formula 1, the content of Si, O or C is a content thereof in the items of the three elements of Si, O and C.

12 Claims, 7 Drawing Sheets

(51) Int. Cl.
*C23C 16/40* (2006.01)
*C23C 16/505* (2006.01)
*B65D 1/40* (2006.01)

(56) References Cited

U.S. PATENT DOCUMENTS

| | | |
|---|---|---|
| 6,805,931 B2 | 10/2004 | Nagashima |
| 2003/0203143 A1 | 10/2003 | Nagashima |
| 2003/0207115 A1 | 11/2003 | Nagashima |
| 2006/0225783 A1 | 10/2006 | Iwanaga |
| 2010/0233886 A1 | 9/2010 | Yang et al. |
| 2012/0009368 A1 | 1/2012 | Nakayama |
| 2012/0205279 A1 | 8/2012 | Mishima et al. |

FOREIGN PATENT DOCUMENTS

| | | |
|---|---|---|
| JP | 63-40314 A | 2/1988 |
| JP | 5-195228 A | 8/1993 |
| JP | 8-53116 A | 2/1996 |
| JP | 2005-200043 A | 7/2005 |
| JP | 2008-127053 A | 6/2008 |
| JP | 2008-208404 A | 9/2008 |
| JP | 2010-219533 A | 9/2010 |
| JP | 2010-235979 A | 10/2010 |
| KR | 1020060108220 | 10/2006 |
| KR | 1020080021613 | 3/2008 |
| WO | 2006/126677 A1 | 11/2006 |
| WO | 2008/062730 A1 | 5/2008 |

OTHER PUBLICATIONS

Written Opinion of PCT/JP2011/080408 dated Apr. 3, 2012.

Si2p

Binding Energy (eV)

| Name | | Posit | FWHM | Gaus% | Int% | Area% |
|---|---|---|---|---|---|---|
| Si1(*m) | Si-Si | 99.00 | (1.49) | - | 92.68 | 45.21 |
| Si2 | SiC,SiO1C3,Si2O etc. | 100.50 | 1.60 | 90 | 55.95 | 29.29 |
| Si3 | SiO2C2,SiO etc. | 101.70 | 1.60 | 90 | 38.98 | 20.40 |
| Si4 | SiO3C1,Si2O3 etc. | 102.70 | 1.60 | 90 | 9.75 | 5.10 |
| Si5 | SiO2 etc. | 103.60 | 1.60 | 90 | 0.00 | 0.00 |

GAS-BARRIER PLASTIC MOLDED PRODUCT AND MANUFACTURING PROCESS THEREFOR

CROSS-REFERENCE TO RELATED APPLICATIONS

This application is a National Stage of International Application No. PCT/JP2011/080408 filed Dec. 28, 2011, claiming priority based on Japanese Patent Application No. 2010-293646 filed Dec. 28, 2010, the contents of all of which are incorporated herein by reference in their entirety.

TECHNICAL FIELD

The present invention relates to a gas barrier plastic molded product and a process for producing the same.

BACKGROUND ART

As a conventional technology for forming a thin film having gas barrier properties (hereinafter, also referred to as a gas barrier thin film), a plasma chemical vapor deposition (CVD) method is available (see, for example, Patent Literature 1). Patent Literature 1 discloses a method of laminating a gas barrier thin film which contains an inorganic oxide as a main component, on the inner surface of a plastic container using an organosilicon compound as a raw material. However, the method for forming a thin film by a plasma CVD method is such that at the time of thin film formation, plasma damages the film surface, so that compactness of the film is prone to damage, and may become an obstacle to an enhancement of the gas barrier properties, or to securement of the adhesiveness of the thin film. Furthermore, since a plasma CVD method ionizes a raw material gas by decomposing the raw material gas with plasma, and causes ions that have been accelerated by an electric field to collide with the surface of a plastic container to form a thin film thereon, the method essentially requires a high frequency power supply and a high frequency electric power adjusting apparatus, and there is a problem that a large amount of money is required for the equipment cost.

In order to solve this problem, the Applicant of the present invention has disclosed a technology for forming a gas barrier thin film on the surface of a plastic container using a method of decomposing a raw material gas by bringing the raw material gas into contact with a heating element that has been caused to generate heat, and depositing the chemical species thus produced as a thin film on a base material directly or after a reaction process in a gas phase, that is, a CVD method which is also called a heating element CVD method, a Cat-CVD method or a hot wire CVD method (hereinafter, in the present specification, referred to as a heating element CVD method) (see, for example, Patent Literature 2 or 3). Patent Literature 2 discloses a technology of forming an $AlO_x$ thin film or a $SiO_x$ thin film as an oxide thin film by using a mixed gas with a non-pyrophoric raw material and ozone as a raw material gas. Patent Literature 3 suggests a technology related to a heating element CVD method by which, for example, a hydrogen-containing $SiN_x$ thin film, a hydrogen-containing DLC thin film, a hydrogen-containing $SiO_x$ thin film, or a hydrogen-containing $SiC_xN_y$ thin film can be formed by combining plural gases as raw material gases.

As a method for forming a gas barrier thin film, in addition to those, a technology for forming a SiN (silicon nitride) or SiON (silicon oxynitride) thin film by a heating element CVD method on the surface of a base material formed from a thermoplastic resin, using a nitrogen-containing gas and a silane-based gas as raw material gases, has been disclosed (see, for example, Patent Literature 4). Furthermore, as a method for forming, not a gas barrier thin film, but a thin film by using a heating element CVD method, for example, a technology for forming a thin film of a chemical species that has been generated by bringing a raw material gas into contact with a heating element that is heated to 800° C. to 2000° C., on a substrate that is heated to 150° C. to 400° C. by a thermal CVD method, has been disclosed (see, for example, Patent Literature 5). Patent Literature 5 discloses a method of depositing a thin film using a gas obtained by mixing plural gases. Furthermore, a technology for enhancing gas barrier properties by means of a SiCN film, using a silazane-based raw material gas, has been disclosed (see, for example Patent Literature 7).

CITATION LIST

Patent Literature

Patent Literature 1: JP 2005-200043 A
Patent Literature 2: JP 2008-127053 A
Patent Literature 3: WO 2006/126677
Patent Literature 4: JP 2008-208404 A
Patent Literature 5: JP 63-40314 A
Patent Literature 6: JP 08-53116 A
Patent Literature 7: JP 2010-235979 A

SUMMARY OF INVENTION

Technical Problem

However, the conventional heating element CVD methods have been methods of using a mixed gas prepared by combining two or more kinds of gases in accordance with the constituent elements of the intended thin film, as a raw material gas. In this method, control of the supply amounts of the various gases is complicated, and it has been difficult to obtain a thin film having high gas barrier properties in a stable manner. Also, there have been occasions in which chemical species different from the intended chemical species are produced, so that there are limitations on the enhancement of the gas barrier properties. Furthermore, according to the investigation of the inventors of the present invention, even if thin films have the same constituent elements, the thin films do not necessarily exhibit the same gas barrier properties, and the gas barrier properties of a thin film depends on the state of bonding between elements in the thin film that has been deposited, or on the state of porosity in the thin film. Heretofore, a technology for forming a thin film having high gas barrier properties using a single kind of raw material gas has not been disclosed. Furthermore, investigations on the kind of heating element that is capable of selectively depositing a thin film having an intended bonding state for the purpose of further enhancing the gas barrier properties, have not been much conducted. For example, the inventors of the present invention have conducted a test assiduously, and they found that in regard to the technology described in Patent Literature 7, in order to enhance the gas barrier properties, it is necessary to heat the substrate to a high temperature, and enhancing the gas barrier properties of a PET substrate cannot be realized because PET substrates have insufficient heat resistance.

Thus, it is an object of the present invention is to provide a gas barrier plastic molded product having high gas barrier properties. Also, a second object of the present invention is to provide a method for producing a plastic molded product having a gas barrier thin film, which can be carried out using a single kind of raw material gas that is highly safe, and using a production apparatus that does not require highly expensive machinery.

Solution to Problem

The gas barrier plastic molded product according to the present invention is a gas barrier plastic molded product comprising a plastic molded product and a gas barrier thin film provided on the surface of the plastic molded product, in which the gas barrier thin film contains silicon (Si), carbon (C), oxygen (O) and hydrogen (H) as constituent elements, and comprises a Si-containing layer having a Si content percentage represented by (Mathematical Formula 1) of 40.1% or more:

Si content percentage [%]={(Si content [atomic %])/
(total content of Si, O and C
[atomic %])}×100     (Mathematical Formula 1)

wherein in Mathematical Formula 1, the content of Si, O or C is a content thereof in the items of the three elements of Si, O and C.

In the gas barrier plastic molded product according to the present invention, the C content percentage represented by (Mathematical Formula 2) in the Si-containing layer is preferably 22.8% to 45.5%:

O content percentage [%]={(O content [atomic %])/
(total content of Si, O and C
[atomic %])}×100     (Mathematical Formula 2)

wherein in Mathematical Formula 2, the content of Si, O or C is a content thereof in the items of the three elements of Si, O and C.

In the gas barrier plastic molded product according to the present invention, the O content percentage represented by (Mathematical Formula 3) in the Si-containing layer is preferably 2.0% to 35.8%:

O content percentage [%]={(O content [atomic %])/
(total content of Si, O and C
[atomic %])}×100     (Mathematical Formula 3)

wherein in Mathematical Formula 3, the content of Si, O or C is a content thereof in the items of the three elements of Si, O and C.

In the gas barrier plastic molded product according to the present invention, the hydrogen content percentage in the Si-containing layer is preferably 21 atomic % to 46 atomic %.

In the gas barrier plastic molded product according to the present invention, the density of the gas barrier thin film is preferably 1.30 g/cm³ to 1.47 g/cm³.

In the gas barrier plastic molded product according to the present invention, it is preferable that when the Si-containing layer is subjected to an X-ray photoelectron spectroscopic analysis (hereinafter, also referred to as an XPS analysis) under condition (1), the spectrum contains a region where a main peak is observed, at the peak appearance position of the bonding energy between Si and Si:

Condition (1): The measurement range is set to 95 eV to 105 eV.

A gas barrier thin film having superior gas barrier properties can be obtained.

In the gas barrier plastic molded product according to the present invention, it is preferable that when the Si-containing layer is subjected to an X-ray photoelectron spectroscopic analysis under condition (2), no peak is observed at the peak appearance position of the bonding energy between Si and Si:

Condition (2): The measurement range is set to 120 eV to 150 eV.

It can be verified that a Si—H bond is present in the Si-containing layer.

In the gas barrier plastic molded product according to the present invention, it is preferable that the gas barrier thin film is formed by a heating element CVD method.

In the gas barrier plastic molded product according to the present invention, the film thickness of the gas barrier thin film is preferably 5 nm or larger. A gas barrier thin film having superior gas barrier properties can be obtained.

The gas barrier plastic molded product according to the present invention includes an embodiment in which the plastic molded product is a container, a film, or a sheet.

The method for producing a gas barrier plastic molded product according to the present invention is a method for producing a gas barrier plastic molded product, the method comprising a film-forming process of forming a gas barrier thin film by bringing a raw material gas into contact with a heating element that has generated heat, decomposing the raw material gas to produce a chemical species, and causing the chemical species to arrive at the surface of the plastic molded product, wherein an organosilane-based compound represented by formula (Chemical Formula 1) is used as the raw material gas, a material containing one or two or more metal elements selected from the group consisting of Mo, W, Zr, Ta, V, Nb and Hf is used as the heating element, and the heat generation temperature of the heating element is set to 1550° C. to 2400° C.

H₃Si—Cn-X     (Chemical Formula 1)

wherein in Chemical Formula 1, n represents 2 or 3; and X represents SiH₃, H, or NH₂.

In the method for producing a gas barrier plastic molded product according to the present invention, the organosilane-based compound represented by the formula (Chemical Formula 1) is preferably vinylsilane, disilabutane, disilylacetylene, or 2-aminoethylsilane. A thin film having superior gas barrier properties can be formed efficiently.

In the method for producing a gas barrier plastic molded product according to the present invention, it is preferable that as the heating element, tantalum metal, a tantalum-based alloy, or tantalum carbide is used; tungsten metal, a tungsten-based alloy, or tungsten carbide is used; molybdenum metal, a molybdenum-based alloy, or molybdenum carbide is used; or hafnium metal, a hafnium-based alloy, or hafnium carbide is used. Since these materials have high catalytic activity, the raw material gas can be more efficiently decomposed. Also, chemical species can be efficiently produced, and a thin film having high gas barrier properties can be formed.

Advantageous Effects of Invention

The present invention is to provide a gas barrier plastic molded product having high gas barrier properties. Also, a second object of the present invention is to provide a method for producing a plastic molded product including a gas barrier thin film, which can be carried out using a single kind of raw material gas that is highly safe, and using a production apparatus which does not require highly expensive machinery.

DESCRIPTION OF EMBODIMENTS

Next, the present invention will be described in detail by way of embodiments, but the present invention is not construed to be limited to these descriptions. So long as the effects of the present invention are provided, various modifications of the embodiments may be made.

Figure 1:
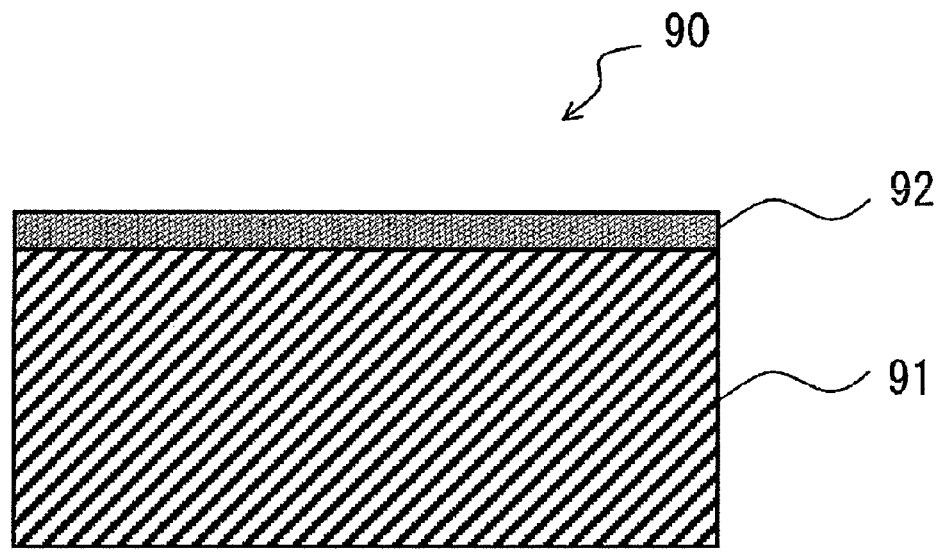
FIG. 1 is a cross-sectional view illustrating the basic configuration of a gas barrier plastic molded product according to the present embodiment.

FIG. 1 is a cross-sectional view illustrating the basic configuration of a gas barrier plastic molded product according to the present embodiment. The gas barrier plastic molded product according to the present embodiment is a gas barrier plastic molded product 90 including a plastic molded product 91 and a gas barrier thin film 92 provided on the surface of the plastic molded product 91, in which the gas barrier thin film 92 contains silicon (Si), carbon (C), oxygen (O) and hydrogen (H) as constituent elements, and includes a Si-containing layer having a Si content percentage represented by (Mathematical Formula 1) of 40.1% or more:

$$\text{Si content percentage [\%]} = \{(\text{Si content [atomic \%]})/(\text{total content of Si, O and C [atomic \%]})\} \times 100 \qquad \text{(Mathematical Formula 1)}$$

wherein in Mathematical Formula 1, the content of Si, O or C is a content thereof in the items of the three elements of Si, O and C.

Examples of the resin that constitutes the plastic molded product 91 include a polyethylene terephthalate resin (PET), a polybutylene terephthalate resin, a polyethylene naphthalate resin, a polyethylene resin, a polypropylene resin (PP), a cycloolefin copolymer resin (COC, cyclic olefin copolymer), an ionomer resin, a poly-4-methylpentene-1 resin, a polymethyl methacrylate resin, a polystyrene resin, an ethylene-vinyl alcohol copolymer resin, an acrylonitrile resin, a polyvinyl chloride resin, a polyvinylidene chloride resin, a polyamide resin, a polyamideimide resin, a polyacetal resin, a polycarbonate resin, a polysulfone resin, a tetrafluoroethylene resin, an acrylonitrile-styrene resin, and an acrylonitrile-butadiene-styrene resin. These can be used as a single layer of one kind, or as a laminate of two or more kinds; however, in view of productivity, a single layer is preferred. Also, the kind of the resin is more preferably PET.

The gas barrier plastic molded product 90 according to the present embodiment includes an embodiment in which the plastic molded product 91 is a container, a film, or a sheet. The shape can be appropriately set in accordance with the purpose and use, and is not particularly limited. The container includes a container used after being covered with a lid, stoppered or sealed, or a container that is used in an open state without using those coverings. The size of the opening can be appropriately set in accordance with the content. The plastic container includes a plastic container having appropriate rigidity and a predetermined thickness, and a plastic container formed using a sheet material which does not have rigidity. The present invention is not intended to the limited to the method for producing a container. Examples of the content include beverages such as water, tea beverages, soft drinks, carbonated beverages, and fruit juice beverages; and foods in the form of a liquid, a viscous material, a powder or a solid. Furthermore, the container may be any of a returnable container, or a one-way container. The film or sheet includes a long sheet-like object, and a cut sheet. It does not matter whether the film or sheet is a stretched product or an unstretched product. The present invention is not intended to be limited to the method for producing the plastic molded product 91.

The thickness of the plastic molded product 91 can be appropriately set in accordance with the purpose and use, and is not particularly limited. When the plastic molded product 91 is, for example, a container such as a bottle for beverages, the thickness of the bottle is preferably 50 µm to 500 µm, and more preferably 100 µm to 350 µm. Furthermore, when the plastic molded product is a film which constitutes a multiwall paper sack, the thickness of the film is preferably 3 µm to 300 µm, and more preferably 10 µm to 100 µm. In the case of a substrate for a flat panel display such as an electronic paper or an organic EL, the thickness of the film is preferably 25 µm to 200 µm, and more preferably 50 µm to 100 µm. In the case of a sheet for forming a container, the thickness of the sheet is preferably 50 µm to 500 µm, and more preferably 100 µm to 350 µm. Also, when the plastic molded product 91 is a container, the gas barrier thin film 92 is provided on any one side or on both sides of the inner wall surface and the outer wall surface. Furthermore, when the plastic molded product 91 is a film, the gas barrier thin film 92 is provided on one surface or on both surfaces.

The gas barrier thin film 92 contains silicon (Si), carbon (C), oxygen (O) and hydrogen (H) as constituent elements, and includes a Si-containing layer having a Si content percentage represented by (Mathematical Formula 1) of 40.1% or more. The Si content percentage of the Si-containing layer is more preferably 40.7% or more. The upper limit of the Si content percentage of the Si-containing layer is preferably set to 57.7%, and more preferably 55.7%. If the Si content percentage of the Si-containing layer is less than 40.1%, the gas barrier properties may be unsatisfactory. The gas barrier thin film 92 is such that as long as the thin film includes a Si-containing layer having a Si content percentage of 40.1% or more, the thin film may also have another layer such as a low Si-containing layer, as an upper layer or a lower layer of the Si-containing layer, or on both sides. Also, the entirety of the gas barrier thin film 92 may be the Si-containing layer.

In the gas barrier plastic molded product according to the present embodiment, the C content percentage represented by (Mathematical Formula 2) in the Si-containing layer is preferably 22.8% to 45.5%, and more preferably 24.8% to 45.4%.

$$\text{C content percentage [\%]} = \{(\text{C content [atomic \%]})/(\text{total content of Si, O and C [atomic \%]})\} \times 100 \qquad \text{(Mathematical Formula 2)}$$

wherein in Mathematical Formula 2, the content of Si, O or C is a content thereof in the items of the three elements of Si, O and C.

In the gas barrier plastic molded product according to the present embodiment, the O content percentage represented by (Mathematical Formula 3) in the Si-containing layer is preferably 2.0% to 35.8%, and more preferably 6.0% to 33.8%.

$$\text{O content percentage [\%]} = \{(\text{O content [atomic \%]})/(\text{total content of Si, O and C [atomic \%]})\} \times 100 \quad \text{(Mathematical Formula 3)}$$

wherein in Mathematical Formula 3, the content of Si, O or C is a content thereof in the items of the three elements of Si, O and C.

The Si content percentage, the C content percentage, or the O content percentage can be measured by, for example, subjecting the gas barrier thin film 92 to an XPS analysis.

In the gas barrier plastic molded product according to the present embodiment, the hydrogen content percentage in the Si-containing layer is preferably 21 atomic % to 46 atomic % (at. %, atom %), and more preferably 25 at. % to 42 at. %. The hydrogen content percentage can be measured by Rutherford backscattering spectrometry (hereinafter, referred to as RBS analysis). By adjusting the hydrogen content relatively larger, deformation of the plastic substrate can be easily complied with. On the contrary, if the hydrogen content is suppressed to a low level, because the film texture is hardened, cracking is prone to occur noticeably at the time of deformation of the plastic substrate. Furthermore, the silicon content percentage of the gas barrier thin film obtainable by an RBS analysis is preferably 20 at. % to 38 at. %, and more preferably 22 at. % to 36 at. %. The carbon content percentage of the gas barrier thin film obtainable by an RBS analysis is preferably 15 at. % to 25. %, and more preferably 18 at. % to 22 at. %. The oxygen content percentage of the gas barrier thin film obtainable by an RBS analysis is preferably 12 at. % to 26 at. %, and more preferably 15 at. % to 21 at. %. Meanwhile, the gas barrier thin film 92 may also contain other elements in addition to Si, C, O and H. Examples of the other elements include metal elements originating from heating elements, such as Mo (molybdenum), and N (nitrogen).

In the gas barrier plastic molded product according to the present embodiment, the density of the gas barrier thin film is preferably 1.30 g/cm$^3$ to 1.47 g/cm$^3$, more preferably 1.33 g/cm$^3$ to 1.46 g/cm$^3$, and particularly preferably 1.35 g/m$^3$ to 1.40 g/m$^3$.

In the gas barrier plastic molded product according to the present embodiment, it is preferable that when the Si-containing layer is subjected to an XPS analysis under condition (1), the spectrum contains a region where a main peak is observed at the peak appearance position of the bonding energy between Si and Si (hereinafter, the peak observed at the peak appearance position of the bonding energy between Si and Si may also be referred to as an Si peak).

Condition (1): The measurement range is set to 95 eV to 105 eV.

When an XPS analysis is carried out under the condition (1), a main peak is observed at the peak appearance position of the bonding energy between Si and Si. Here, according to the present specification, the main peak means a peak having the highest intensity among the peaks observed after peak separation under the condition (1). The bonding state assumed from the peak appearing at the peak appearance position of the bonding energy between Si and Si is a Si—Si bond or a Si—H bond. In the present embodiment, it is preferable that the major bond of the Si peak be a Si—H bond. Examples of the form of bond in the compound contained in the gas barrier thin film 92 in addition to the Si—Si bond or the Si—H bond include a Si—C bond, a Si—O bond, a C—H bond, a C—C bond, a C—O bond, a Si—O—C bond, a C—O—C bond, and an O—C—O bond.

In the gas barrier plastic molded product according to the present embodiment, it is preferable that when the Si-containing layer is subjected to an XPS analysis under condition (2), no peak is observed at the peak appearance position of the bonding energy between Si and Si.

Condition (2): The measurement range is set to 120 eV to 150 eV.

Which of the Si—Si bond and the Si—H bond in the Si peak preponderates over the other can be checked by performing an XPS analysis under the condition (1) and condition (2). That is, under condition (1), a peak is present at the peak appearance position of the bonding energy between Si and Si, and under condition (2), there is no peak at the peak appearance position of the bonding energy between Si and Si. Therefore, it can be confirmed that the Si peak indicates the Si—H bond. Thereby, the Barrier Improvement Factor (hereinafter, referred to as BIF) that is determined by (Mathematical Formula 4) can be adjusted to 6 or greater.

$$\text{BIF} = [\text{Oxygen permeability of plastic molded product without a thin film formed thereon}]/[\text{oxygen permeability of gas barrier plastic molded product}] \quad \text{(Mathematical Formula 4)}$$

According to the investigation of the inventors of the present invention, it is preferable, in order to exhibit higher gas barrier properties, that the gas barrier thin film 92 have a gradient composition in which the bond between Si and H (Si—H bond) is unevenly distributed, at the surface of the thin film. The issue of whether the gas barrier thin film 92 has a gradient composition can be checked by performing argon ion etching in the XPS analysis under the condition (1). According to the analysis results, at the surface of the gas barrier thin film 92, the Si peak is a main peak, and as the analysis progresses toward the plastic molded product, the main peak is shifted to the higher bonding energy side. Thereby, it is speculated that although there are many Si—H bonds at the surface, as the analysis progresses toward the direction of the plastic molded product, the composition changes gradually from SiC to SiOC having more carbon than oxygen, and to SiOC having more oxygen than carbon, and SiOx is obtained at the interface of the plastic molded product. The reason for having such a gradient composition is not clearly understood. However, it is speculated that at the interface of the plastic molded product during the film-forming process, SiO-based compounds such as SiO$_2$ or SiOx are deposited under the effect of oxygen originating from the plastic molded product, but from the area 5 nm away from the interface of the plastic molded product, the influence of the plastic molded product decreases, the content percentage of O decreases, and the compounds that are deposited become SiC-based compound as in the case of converting from SiOC to SiC, so that the surface of the thin film comes to contain many Si—H bonds.

In the gas barrier plastic molded product 90 according to the present embodiment, the film thickness of the gas barrier thin film 92 is preferably 5 nm or larger, and more preferably 10 nm or larger. If the film thickness is less than 5 nm, the gas barrier properties may be unsatisfactory. Furthermore, the upper limit of the film thickness of the gas barrier thin film 92 is preferably set to 200 nm, and more preferably 100 nm. If the film thickness of the gas barrier thin film 92 is larger than 200 nm, cracking is prone to occur due to the internal stress.

In the gas barrier plastic molded product 90 according to the present embodiment, it is preferable that the gas barrier thin film 92 is formed by a heating element CVD method. The heating element CVD method is a method of bringing a raw material gas into contact with a heating element that has generated heat as a result of electrification and heating in a vacuum chamber to decompose the raw material gas, and depositing the chemical species thus produced as a thin film on a base material directly or after a reaction process in a gas phase. It may vary depending on the softening temperature of the heating element, but the heating element is generally caused to generate heat at 200° C. to 2200° C. However, as spaces are left between the base material and the heating element, the temperature of the base material can be maintained at a low temperature of from normal temperature to about 200° C., and a thin film can be formed without damaging a base material that is labile to heat, such as a plastic. Furthermore, as compared with other chemical vapor deposition methods such as plasma CVD, or physical vapor deposition (PVD) methods such as a vacuum deposition method, a sputtering method, and an ion plating method, a simpler apparatus is used, and the cost of the apparatus itself can be suppressed to a low level. In the heating element CVD method, since a gas barrier thin film is formed by deposition of a chemical species, a compact film having a high apparent density can be obtained as compared with wet methods.

Figure 2:
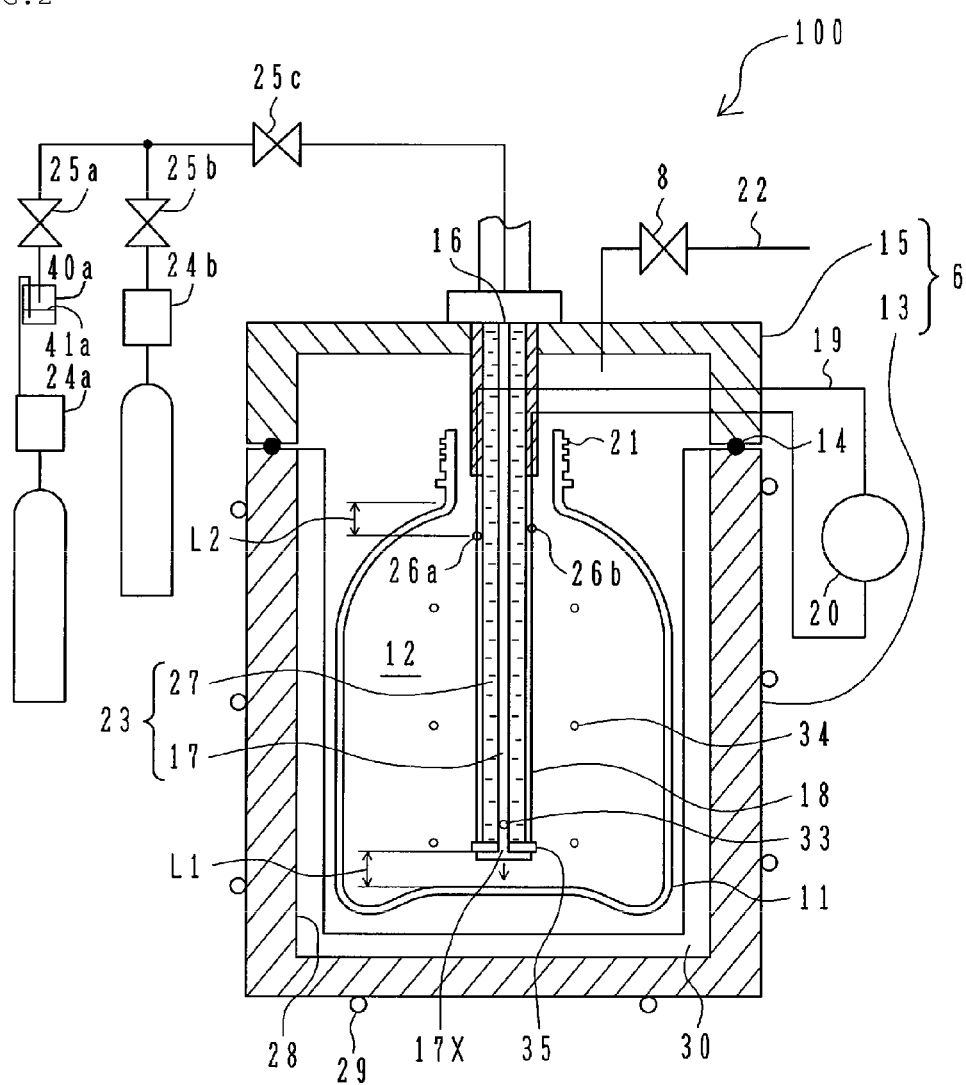
FIG. 2 is a schematic diagram illustrating an embodiment of the film-forming apparatus.

Next, a film-forming apparatus which is capable of forming a gas barrier thin film on the surface of a plastic molded product will be explained. FIG. 2 is a schematic diagram illustrating an embodiment of the film-forming apparatus. FIG. 2 shows an apparatus which uses a plastic container 11 as a plastic molded product 91, and forms a gas barrier thin film 92 on the inner surface of a plastic container 11.

The apparatus 100 for producing a gas barrier plastic container illustrated in FIG. 2 includes a vacuum chamber 6 that accommodates a plastic container 11 as a plastic molded product 91; an exhaust pump (not illustrated in the diagram) that draws a vacuum in the vacuum chamber 6; a raw material gas supply pipe 23 that is formed from an insulating and heat resistant material, which is disposed to be insertable and removable from the interior of the plastic container 11 and supplies a raw material gas into the interior of the plastic container 11; a heating element 18 supported by the raw material gas supply pipe 23; and a heater power supply 20 that generates heat by passing electricity through the heating element 18.

The vacuum chamber 6 has formed therein a space for accommodating the plastic container 11, and the space serves as a reaction chamber 12 for thin film formation. The vacuum chamber 6 is composed of a lower chamber 13; and an upper chamber 15 that is mounted to be attachable and detachable from the upper part of this lower chamber 13 and is configured to tightly seal the interior of the lower chamber 13 with an O-ring 14. The upper chamber 15 includes a vertically driving mechanism that is not illustrated in the diagram, and this mechanism moves up and down along with the carry-in and carry-out of the plastic container 11. The internal space of the lower chamber 13 is formed to be slightly larger than the outer shape of the plastic container 11 that is accommodated therein.

The interior of the vacuum chamber 6, particularly the interior of the lower chamber 13, is preferably such that in order to prevent reflection of the light radiated upon heat generation of the heating element 18, the inner surface 28 forms a black inner wall, or the inner surface has surface asperities with a surface roughness (Rmax) of 0.5 μm or greater. The surface roughness (Rmax) is measured using, for example, a surface roughness meter (manufactured by Ulvac Techno, Ltd.; DEKTAX3). In order to make the inner surface 28 into a black inner wall, a plating treatment such as black nickel plating or black chromium plating; a chemical coating film treatment such as Raydent/black oxide finish; or a method of coloring by applying a black coating material may be used. Furthermore, it is preferable to provide a cooling unit 29 such as a cooling pipe through which cooling water flows, in the inside or outside of the vacuum chamber 6, and to thereby prevent a temperature rise in the lower chamber 13. In the vacuum chamber 6, particularly the lower chamber 13 is targeted because when the heating element 18 is inserted into the plastic container 11, the heating element 18 is in a state of being exactly fitted in the internal space of the lower chamber 13. By preventing reflection of light and performing cooling of the vacuum chamber 6, a temperature rise in the plastic container 11 and subsequent thermal deformation can be suppressed. Furthermore, when a chamber 30 formed from a transparent body through which the radiation light generated from the electrified heating element 18 can pass, for example, a chamber made of glass, is disposed inside the lower chamber 13, since the temperature of the glass chamber that is in contact with the plastic container 11 does not rise easily, the thermal effect exerted to the plastic container 11 can be further reduced.

The raw material gas supply pipe 23 is supported to be suspended downward at the center of the inner ceiling surface of the upper chamber 15. In the raw material gas supply pipe 23, a raw material gas 33 is allowed to flow in via flow rate regulators 24a and 24b, and valves 25a to 25c. In regard to the supply of the raw material gas 33, when the starting raw material is a liquid, the material can be supplied by a bubbling method. That is, a bubbling gas is supplied to the starting raw material 41a accommodated in a raw material tank 40a while the flow rate is controlled by a flow rate regulator 24a, and a vapor of the starting raw material 41a is generated and supplied as the raw material gas 33.

It is preferable that the raw material gas supply pipe 23 has a cooling pipe and be formed in an integrated form. An example of the structure of such a raw material gas supply pipe 23 may be a double pipe structure. In regard to the raw material gas supply pipe 23, the inner pipeline of the double pipe serves as a raw material gas flow channel 17, and one end thereof is connected to a gas supply port 16 provided in the upper chamber 15, while the other end serves as a gas outlet port 17x. It is set up such that the raw material gas is thereby blown through the gas outlet port 17x at the tip of the raw material gas flow channel 17 that is connected to the gas supply port 16. On the other hand, the outer pipeline of the double pipe is a cooling water flow channel 27 for cooling the raw material gas supply pipe 23, and plays the role as a cooling pipe. Also, when the heating element 18 is electrified and generates heat, the temperature of the raw material gas flow channel 17 rises. In order to prevent this, cooling water is circulating through the cooling water flow channel 27. That is, at one end of the cooling water flow channel 27, cooling water is supplied from a cooling water supply unit, which is not illustrated in the diagram, connected to the upper chamber 15, and at the same time, the cooling water that has accomplished cooling is returned to the cooling water supply unit. On the other hand, the other end of the cooling water flow channel 27 is sealed in the vicinity of the gas outlet port 17x, and the cooling water is turned back and returned here. The cooling water flow channel 27 cools the entirety of the raw material gas supply pipe 23. Through cooling, the thermal effect exerted on the plastic container 11 can be reduced. Therefore, the material for the raw material gas supply pipe 23 is desirably an insulator having high heat conductivity. For example, the raw material gas supply pipe is preferably a ceramic pipe formed from a material containing aluminum nitride, silicon carbide, silicon nitride, or aluminum oxide as a main component; or a metal pipe having the surface coated with a material containing aluminum nitride, silicon carbide, silicon nitride or aluminum oxide as a main component. Such a material enables the heating element to be stably electrified, has durability, and can efficiently exhaust the heat generated at the heating element through thermal conduction.

According to another form that is not illustrated in the diagram, the raw material gas supply pipe 23 may also have a configuration as follows. That is, the raw material gas supply pipe is made into a double pipe, and the outer pipeline is used as a raw material gas flow channel. Holes, and preferably a plural number of holes, are bored in the side wall of the outer pipe. On the other hand, the inner pipe of the double pipe of the raw material gas supply pipe is formed with a compact pipe, and cooling water is allowed to flow therethrough as a cooling water flow channel. The heating element is wired along the side wall of the raw material gas supply pipe, but the raw material gas that has passed through the holes provided in the side wall of the outer pipe is brought into contact with the heating element in the area along the side wall, and can efficiently produce chemical species.

If the gas outlet port 17x is too far apart from the bottom of the plastic container 11, it is difficult to form a thin film in the inside of the plastic container 11. In the present embodiment, the length of the raw material gas supply pipe 23 is preferably formed such that the distance L1 from the gas outlet port 17x to the bottom of the plastic container 11 is 5 mm to 50 mm. Uniformity of the film thickness is enhanced. At a distance of 5 mm to 50 mm, a uniform thin film can be formed on the inner surface of the plastic container 11. If the distance is larger than 50 mm, it may be difficult to form a thin film on the bottom of the plastic container 11. Furthermore, if the distance is smaller than 5 mm, blowing of the raw material gas may become impossible, or the film thickness distribution may be non-uniform. This fact can also be understood theoretically. In the case of a container having a volume of 500 ml, since the shell diameter of the container is 6.4 cm, and the mean free path of air at normal temperature, $\lambda$ is from 0.68/Pa [cm], the molecular flow is such that pressure <0.106 Pa, the viscous flow is such that pressure >10.6 Pa, and the intermediate flow is such that 0.106 Pa<pressure<10.6 Pa. At a gas pressure of 5 Pa to 100 Pa at the time of film formation, the flow of gas is converted from an intermediate flow to a viscous flow, and there may be optimal conditions for the distance between the gas outlet port 17x and the bottom of the plastic container 11.

The heating element 18 accelerates decomposition of the raw material gas. The heating element 18 is formed in a wire form, and one end of the heating element 18 is connected to a connection area 26a that serves as a connection site between a wire 19 and the heating element 18, which is provided below a fixed site in the upper chamber 15 of the raw material gas supply pipe 23. The heating element 18 is then supported by an insulating ceramic 35 provided at the gas outlet port 17x, which is a tip part. Furthermore, the heating element is turned back, and the other end of the heating element 18 is connected to a connection area 26b. As such, since the heating element 18 is supported along the side surface of the raw material gas supply pipe 23, the heating element 18 is disposed so as to be positioned almost on the main axis of the internal space of the lower chamber 13. FIG. 2 shows the case in which the heating element 18 is disposed along the circumference of the raw material gas supply pipe 23 so as to be parallel to the axis of the raw material gas supply pipe 23; however, starting from the connection area 26a as a starting point, the heating element 18 may also be wound in a helical shape along the side surface of the raw material gas supply pipe 23, supported by an insulating ceramic 35 fixed in the vicinity of the gas outlet port 17x, and then turned back toward the connection area 26b. Here, the heating element 18 is fixed to the raw material gas supply pipe 23 by being hung up on the insulating ceramic 35. FIG. 2 shows the case in which the heating element 18 is disposed on the exit side of the gas outlet port 17x in the vicinity of the gas outlet port 17x of the raw material gas supply pipe 23. Since the raw material gas blown out through the gas outlet port 17x can be thereby easily brought into contact with the heating element 18, the raw material gas can be efficiently activated. Here, it is preferable that the heating element 18 be disposed to be slightly apart from the side surface of the raw material gas supply pipe 23. This is done in order to prevent a rapid temperature rise of the raw material gas supply pipe 23. Also, the chances of contact between the raw material gas blown out through the gas outlet port 17x and the raw material gas in the reaction chamber 12 can be increased. The outer diameter of the raw material gas supply pipe 23 including this heating element 18 is necessarily smaller than the inner diameter of an opening 21 of the plastic container. This is because the raw material gas supply pipe 23 including the heating element 18 should be inserted through the opening 21 of the plastic container. Therefore, if the heating element 18 is separated apart more than needed from the surface of the raw material gas supply pipe 23, when the raw material gas supply pipe 23 is inserted through the opening 21 of the plastic container, the heating element is more likely to be brought into contact with the opening. When the positional shift at the time of insertion through the opening 21 of the plastic container is considered, the breadth of the heating element 18 appropriately more than or equal to 10 mm, and less than or equal to (inner diameter of opening 21 −6) mm. For example, the inner diameter of the opening 21 is generally 21.7 mm to 39.8 mm.

Since the heating element 18 is electrically conductive, the heating element 18 can be caused to generate heat by, for example, electrification. In the apparatus illustrated in FIG. 2, a heater power supply 20 is connected to the heating element 18 via the connection areas 26a and 26b, and the wire 19. When electricity is passed through the heating element 18 by the heater power supply 20, the heating element 18 generates heat. Meanwhile, the present invention is not intended to be limited to the heat generation method using the heating element 18.

Furthermore, concerning the part from the opening 21 of the plastic container to the shoulder of the container, since the stretch ratio at the time of molding of the plastic container 11 is small, if the heating element 18 that generates heat at a high temperature is disposed nearby, the part may be easily deformed by heat. According to an experiment, unless the positions of the connection areas 26a and 26b, which are the connection sites between the wire 19 and the heating element 18, were separated by 10 mm or more from the lower end of the opening 21 of the plastic container, the shoulder area of the plastic container 11 underwent thermal deformation. If the distance was greater than 50 mm, it was difficult to form a thin film on the shoulder area of the plastic container 11. Thus, it is desirable that the heating element 18 be disposed such that the upper end is located 10 mm to 50 mm below from the lower end of the opening 21 of the plastic container. That is, it is preferable that the distance L2 between the connection areas 26a and 26b and the lower end of the opening 21 be set to 10 mm to 50 mm. Thermal deformation of the shoulder part of the container can be suppressed.

Furthermore, in the internal space of the upper chamber 15, an exhaust pipe 22 is in communication with the space through a vacuum valve 8, and air in the reaction chamber 12 inside the vacuum chamber 6 is exhausted therethrough by an exhaust pump that is not illustrated in the diagram.

Next, the method for producing a gas barrier plastic molded product according to the present embodiment will be described with reference to FIG. 2, while taking an example of the case in which a gas barrier thin film is formed on the inner surface of a gas barrier plastic container 11. The method for producing a gas barrier plastic molded product according to the present embodiment is a method for producing a gas barrier plastic molded product, the method including a film-forming process of forming a gas barrier thin film by bringing a raw material gas 33 into contact with a heating element 18 that has generated heat, thereby decomposing the raw material gas 33 to produce a chemical species 34, and causing the chemical species to arrive at the surface of a plastic molded product (in FIG. 2, the inner surface of the plastic container 11), wherein an organosilane-based compound represented by formula (Chemical Formula 1) is used as the raw material gas 33, a material containing one or two or more metal elements selected from the group consisting of Mo, W, Zr, Ta, V, Nb and Hf is used as the heating element 18, and the heat generation temperature of the heating element 18 is set to 1550° C. to 2400° C.:

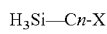  (Chemical Formula 1)

wherein in Chemical Formula 1, n represents 2 or 3; and X represents $SiH_3$, H, or $NH_2$.

In the case of forming a thin film using the aforementioned organosilane-based compound represented by formula (Chemical Formula 1) as the raw material gas, when a plasma CVD method is used, the oxygen permeability of a 500-ml PET bottle is suppressed only up to about ½ of the original value, and this is insufficient in view of practical performance. When a thin film formed of DLC or $SiO_x$ is formed by a plasma CVD method, it is known that the oxygen permeability of a 500-ml PET bottle can be reduced to 1/10 or less of the original value. However, when a carbonated beverage is filled therein, the gas barrier properties deteriorate along with expansion of the bottle. Specifically, when 4 GV (gas volumes) of carbonated water is filled in a 500-ml PET bottle (resin amount 23 g) in which a DLC film or a $SiO_x$ film has been formed by a plasma CVD method, and the bottle is maintained for 5 days under the conditions of 38° C., usually the capacity of the PET bottle expands by 18 $cm^3$ to 21 $cm^3$ (in the case of a PET bottle that has not been subjected to film formation, 22 $cm^3$ to 26 $cm^3$), and the oxygen permeability after expansion increases to 1.5 to 2.9 times. These results comprehensively illustrate the expansion of PET bottles and the damage in the thin film caused by the expansion. On the other hand, in the case of forming a thin film using the organosilane-based compound represented by formula (Chemical Formula 1) as the raw material gas, when a heating element CVD method is used, the oxygen permeability in a 500-ml PET bottle can be reduced to, for example, 1/10 or less of the original value, and sufficient practical performance can be obtained. Furthermore, when a carbonated beverage is filled therein, expansion of the bottle can be effectively suppressed, and the gas barrier properties substantially do not deteriorate. Specifically, when 4 GV (gas volumes) of carbonated water is filled in a 500-ml PET bottle (resin amount 23 g) in which a film has been formed by using a heating element CVD method, and the bottle is maintained for 5 days under the conditions of 38° C., usually the bottle capacity expands only by 13 $cm^3$ to 17 $cm^3$ (in the case of a bottle that has not been subjected to film formation, 22 $cm^3$ to 26 $cm^3$), and the oxygen permeability after the expansion is limited to an increase to 1.2 to 1.3 times.

(Mounting of Plastic Molded Product in Film-Forming Apparatus)

First, the interior of the vacuum chamber 6 is opened to the atmosphere by opening a vent (not illustrated in the diagram). In the reaction chamber 12, the plastic container 11 is inserted as the plastic molded product 91 through the upper opening of the lower chamber 13, while the upper chamber 15 is removed, and is accommodated therein. Thereafter, the upper chamber 15 that has been positioned is lowered down, and the raw material gas supply pipe 23 attached to the upper chamber 15, and the heating element 18 that is fixed thereto are inserted into the plastic container 11 through the opening 21 of the plastic container. Then, the upper chamber 15 comes into contact with the lower chamber 13 with an O-ring 14 inserted therebetween, and thereby, the reaction chamber 12 is made into a tightly sealed space. At this time, the distance between the inner wall surface of the lower chamber 13 and the outer wall surface of the plastic container 11 is maintained almost uniformly, and the distance between the inner wall surface of the plastic container 11 and the heating element 18 is also maintained almost uniformly.

(Pressure Regulation Process)

Next, the vent (not illustrated in the diagram) is closed, and the exhaust pump (not illustrated in the diagram) is operated to open the vacuum valve 8, and thereby, the reaction chamber 12 is evacuated. At this time, not only the internal space of the plastic container 11 but also the space between the outer wall surface of the plastic container 11 and the inner wall surface of the lower chamber 13 are also evacuated, and thereby a vacuum is drawn. That is, the entirety of the reaction chamber 12 is evacuated. Then, it is preferable that the pressure inside the reaction chamber 12 be reduced until the pressure reaches a required level, for example, 1.0 Pa to 100 Pa. More preferably, the pressure is 1.4 Pa to 50 Pa. If the pressure is lower than 1.0 Pa, the evacuation time may take long. Furthermore, if the pressure is higher than 100 Pa, the amount of impurities may increase inside the plastic container 11, and a container having high barrier properties may not be obtained. When the pressure is reduced from atmospheric pressure to reach 1.4 Pa to 50 Pa, an appropriate residual water vapor pressure originating from the atmosphere, apparatus and container can be obtained together with an appropriate vacuum pressure, and a thin film having barrier properties can be formed conveniently and easily.

(Film-Forming Process—Electrification of Heating Element)

Next, the heating element 18 is caused to generate heat by, for example, electrification. The material of the heating element 18 is a material containing one or two or more metal elements selected from the group consisting of Mo (molybdenum), W (tungsten), Zr (zirconium), Ta (tantalum), V (vanadium), Nb (niobium), and Hf (hafnium). More preferably, the material is a material containing one or two or more metal elements selected from the group consisting of Mo, W, Zr and Ta. The heat generation temperature of the heating element 18 is set to 1550° C. to 2400° C., and more preferably to 1700° C. to 2100° C. If the heat generation temperature is lower than 1550° C., the raw material gas cannot be efficiently decomposed, and a long time is taken to form a film, so that the operation efficiency is poor. If the heat generation temperature is higher than 2400° C., the heat generation temperature is excessively high, and it is economically inefficient. Furthermore, the heating element may be deformed depending on the material of the heating element 18. There is a risk of thermal damage to the plastic molded product.

The material containing a metal element that is used in the heating element 18 is preferably a pure metal, an alloy, or a carbide of a metal. In the case of using an alloy containing Mo, W, Zr, Ta, V, Nb or Hf as a main component as the heating element 18, in the relevant alloy, the content of the components other than the metal that is the main component is preferably 25% by mass or less, more preferably 10% by mass or less, and even more preferably 1% by mass or less. Furthermore, in the case of using tantalum carbide ($TaC_x$) as the heating element 18, the ratio of carbon atoms in tantalum carbide (TaC$_X$) as a mass ratio is preferably greater than 0% by mass and less than or equal to 6.2% by mass, and more preferably from 3.2% by mass to 6.2% by mass. In the case of using hafnium carbide (HfC$_X$) as the heating element 18, the ratio of carbon atoms in hafnium carbide (HfC$_X$) as a mass ratio is preferably greater than 0% by mass and less than or equal to 6.3% by mass, and more preferably from 3.2% by mass to 6.3% by mass. In the case of using tungsten carbide (WC$_X$) as the heating element 18, the ratio of carbon atoms in tungsten carbide (WC$_X$) as a mass ratio is preferably greater than 0% by mass and less than or equal to 6.1% by mass, and more preferably from 3.0% by mass to 6.1% by mass. In the case of using molybdenum carbide (MoC$_X$) as the heating element 18, the ratio of carbon atoms in molybdenum carbide (MoC$_X$) as a mass ratio is preferably greater than 0% by mass and less than or equal to 5.9% by mass, and more preferably from 2.9% by mass to 5.9% by mass.

(Film-Forming Process—Introduction of Raw Material Gas)

Thereafter, an organosilane-based compound represented by formula (Chemical Formula 1) is supplied as the raw material gas 33. In Chemical Formula 1, the bond between carbon atoms in the hydrocarbon structure corresponding to Cn may be any of a single bond, a double bond, and a triple bond. More preferably, the hydrocarbon structure is a straight chain-like structure. Furthermore, it is preferable that the organosilane-based compound have a double bond or a triple bond, which has a lower hydrogen content. For example, when n=2, embodiment examples of Cn include an embodiment in which the bond between C—C is a single bond (C$_2$H$_4$); an embodiment in which the bond between C—C is a double bond (C$_2$H$_2$); and an embodiment in which the bond between C—C is a triple bond (C$_2$). When n=3, embodiment examples of Cn include an embodiment in which the bonds between C—C are single bonds (C$_3$H$_6$); an embodiment in which the bonds between C—C are a single bond and a double bond (C$_3$H$_4$); and an embodiment in which the bonds between C—C are a single bond and a triple bond (C$_3$H$_2$). Specifically, examples of the organosilane-based compound represented by formula (Chemical Formula 1) include vinylsilane (H$_3$SiC$_2$H$_3$), disilabutane (H$_3$SiC$_2$H$_4$SiH$_3$), disilylacetylene (H$_3$SiC$_2$SiH$_3$), and 2-aminoethylsilane (H$_3$SiC$_2$H$_4$NH$_2$). Among these, the organosilane-based compound is preferably vinylsilane, disilabutane, or disilylacetylene.

The raw material gas 33 is supplied while the flow rate is controlled by a gas flow rate regulator 24a. Furthermore, if necessary, a carrier gas is mixed with the raw material gas 33 in front of a valve 25c while the flow rate of the carrier gas is controlled by a gas flow rate regulator 24b. The carrier gas is, for example, an inert gas such as argon, helium or nitrogen. Then, the raw material gas 33 is blown, while the flow rate is controlled with the gas flow rate regulator 24a, or while the flow rate is controlled by the carrier gas, toward the heating element 18 that has generated heat, through the gas outlet port 17x of the raw material gas supply pipe 23 inside the plastic container 11 where the pressure has been reduced to a predetermined pressure. As such, it is preferable to initiate spraying of the raw material gas 33 after an increase in temperature of the heating element 18 is completed. From an early stage of film formation, a chemical species 34 that has been sufficiently activated by the heating element 18 can be produced, and a film having high gas barrier properties can be obtained.

When the raw material gas 33 is a liquid, the raw material gas can be supplied by a bubbling method. The bubbling gas that is used for the bubbling method is, for example, an inert gas such as nitrogen, argon or helium, and nitrogen gas is more preferred. That is, when the starting raw material 41a inside the raw material tank 40a is bubbled using a bubbling gas while the flow rate is controlled with a gas flow rate regulator 24a, the starting raw material 41a is vaporized and is incorporated into bubbles. In this manner, the raw material gas 33 is supplied in a state of being mixed with the bubbling gas. Furthermore, a carrier gas is mixed with the raw material gas 33 in front of the valve 25c while the flow rate is controlled with the gas flow rate regulator 24b. Then, the raw material gas 33 is blown, while the flow rate is controlled by the carrier gas, toward the heating element 18 that has generated heat, through the gas outlet port 17x of the raw material gas supply pipe 23 inside the plastic container 11 where the pressure has been reduced to a predetermined pressure. Here, the flow rate of the bubbling gas is preferably 3 sccm to 50 sccm, and more preferably 5 sccm to 15 sccm. The flow rate of the carrier gas is not particularly limited, but the flow rate is preferably 0 sccm to 80 sccm. More preferably, the flow rate is 5 sccm to 50 sccm. By means of the flow rate of the carrier gas, the pressure inside the plastic container 11 can be adjusted to 20 Pa to 80 Pa.

(Film-Forming Process—Film Formation)

When the raw material gas 33 is brought into contact with the heating element 18, a chemical species 34 is produced. When this chemical species 34 arrives at the inner wall of the plastic container 11, a gas barrier thin film is deposited. In the film-forming process, the time taken for causing the heating element 18 to generate heat and spraying the raw material gas 33 to the heating element 18 (hereinafter, also called the duration of film formation) is preferably 1.0 second to 20 seconds, and more preferably 1.0 second to 8.5 seconds. The pressure inside the vacuum chamber at the time of film formation is, for example, preferably reduced until a pressure of 1.0 Pa to 100 Pa is attained. The pressure is more preferably 1.4 Pa to 50 Pa.

According to the experiment carried out by the inventors of the present invention, a thin film formed suing an organosilane-based compound other than the organosilane-based compound represented by formula (Chemical Formula 1) (for example, monomethylsilane, dimethylsilane, trimethylsilane, tetramethylsilane, or dimethoxymethylvinylsilane) as the raw material gas was such that when the surface was subjected to an XPS analysis under the condition (1), no Si peak was observed, and a main peak based on SiO, SiC or SiOC was observed. A plastic molded product including this thin film had a BIF value of less than 3, and it was confirmed that a thin film having high gas barrier properties cannot be obtained with a single kind of gas. Furthermore, when a metal other than Mo, W, Zr, Ta, V, Nb or Hf (for example, Ir (iridium), Re (rhenium), Pt (platinum), Rh (rhodium), Ti (titanium), or Cr (chromium)) was used as the heating element, there was a problem that even if an organosilane-based compound represented by formula (Chemical Formula 1) was used as the raw material gas, the film-forming efficiency was poor, and productivity was also poor. Also, when the surface of an ultra-thin film thus obtained was subjected to an XPS analysis under the condition (1), no Si peak was observed, and a main peak based on SiO$_2$ was observed to a small extent. On the other hand, since the gas barrier plastic molded product according to the present embodiment uses an organosilane-based compound represented by formula (Chemical Formula 1) as the raw material gas 33, and a material containing one or two or more metal elements selected from the group consisting of Mo, W, Zr, Ta, V, Nb and Hf is used as the material of the heating element 18, a thin film having high gas barrier properties and having a BIF value of 15 or greater could be formed even when the raw material gas 33 was a single kind of gas.

Furthermore, when tantalum metal, a tantalum-based alloy or tantalum carbide ($TaC_x$) is used as the material containing tantalum element; when tungsten metal, a tungsten-based alloy or tungsten carbide ($WC_x$) is used as the material containing tungsten element; when molybdenum metal, a molybdenum-based alloy or molybdenum carbide ($MoC_x$) is used as the material containing molybdenum element; or when hafnium metal, a hafnium-based alloy or hafnium carbide ($HfC_x$) is used as the material containing hafnium element, since these materials have high catalytic activity, the raw material gas can be decomposed more efficiently. Furthermore, since the chemical species 34 is efficiently produced and a compact film is deposited, a thin film having high gas barrier properties can be formed.

In the heating element CVD method, the adhesiveness between the plastic container 11 and the gas barrier thin film is very good. When hydrogen gas is introduced through the raw material gas flow channel 17, the hydrogen gas is activated by a contact decomposition reaction with the heating element 18, and cleaning of the surface of the plastic container 11 can be carried out using this active species. More specifically, a hydrogen abstraction reaction or an etching operation by means of activated hydrogen H* or hydrogen radical (atomic hydrogen) H can be expected.

Furthermore, when $NH_3$ gas is introduced through the raw material gas flow channel 17, an active species is produced by a contact decomposition reaction with the heating element 18, and a surface treatment of modifying the surface of the plastic container 11 and thereby stabilizing the surface can be carried out by means of the active species. More specifically, addition of a nitrogen-containing functional group to the surface, or a crosslinking reaction of the polymer chains of the plastic can be expected.

The film thickness of the gas barrier thin film may vary depending on the material of the heating element 18, the pressure of the raw material gas inside the plastic container 11, the flow rates of supplied gases, the duration of film formation, and the like; however, in order to attempt a good balance between the gas barrier property enhancing effect, and the adhesiveness to the plastic container 11, durability, transparency and the like, the film thickness is preferably adjusted to 5 nm to 200 nm. The film thickness is more preferably 10 nm to 100 nm.

(Completion of Film Formation)

When the thin film has acquired a predetermined thickness, supply of the raw material gas 33 is stopped, the reaction chamber 12 is evacuated again, and a leak gas that is not illustrated in the diagram is introduced therein to thereby adjust the pressure in the reaction chamber 12 to atmospheric pressure. Thereafter, the upper chamber 15 is opened, and the plastic container 11 is taken out. The gas barrier plastic molded product obtained in this manner can have a BIF value of 6 or greater. In a specific example, for a 500-ml PET bottle (height: 133 mm, outer diameter of the cylinder: 64 mm, outer diameter of the opening: 24.9 mm, inner diameter of the opening: 21.4 mm, thickness: 300 μm, and resin amount: 29 g), the oxygen permeability can be adjusted to 0.0058 cc/container/day or less. For a 720-ml PET bottle (height: 279 mm, outer diameter of the cylinder: 70 mm, outer diameter of the opening: 24.9 mm, inner diameter of the opening: 21.4 mm, thickness: 509 μm, and resin amount: 38 g), the oxygen permeability can be adjusted to 0.0082 cc/container/day or less.

In the present embodiment, a thermal annealing process may also be carried out. The thermal annealing process can be carried out after the thin film has acquired a predetermined thickness, supply of the raw material gas 33 is stopped, and the reaction chamber is evacuated for a certain time. By carrying out the thermal annealing process, the oxygen permeability of the gas barrier film can be further reduced. The heat generation temperature of the heating element 18 in the thermal annealing process is preferably 1450° C. or higher, and more preferably 1950° C. or higher. If the heat generation temperature is lower than 1450° C., the effect of the thermal annealing treatment may not be obtained. Furthermore, the upper limit of the thermal generation temperature is preferably set to a temperature lower than the softening temperature of the heating element 18. The upper limit temperature may vary with the material of the heating element, but for example, the upper limit temperature is preferably 2400° C. in the case of molybdenum. The time for causing the heating element to generate heat in the thermal annealing process is preferably 1.0 second to 5.0 seconds, and more preferably 1.5 seconds to 2.0 seconds. In the case of carrying out the thermal annealing process, electrification of the heating element 18 is terminated after the thermal annealing process.

In the method for producing a gas barrier plastic molded product according to the present embodiment, it is preferable that the method include, after the film-forming process, a regeneration process for the heating element 18, in which an oxidizing gas is added to the atmosphere, and the heating element is heated. When an organosilane-based compound is used as the raw material gas, and the film-forming process is repeatedly carried out under the same conditions, carbonization proceeds at the surface of the heating element 18 after about 30 rounds of the process, and the gas barrier properties of the gas barrier thin film 92 may deteriorate. As a countermeasure, it is preferable to carry out a regeneration process for the heating element 18, in which carbon components are removed from the surface of the heating element 18. The regeneration process for the heating element 18 can easily remove carbon components from the surface of the heating element 18 by bringing an oxidizing gas into contact with the heating element 18 that has generated heat inside the vacuum chamber 6 where the pressure has been adjusted to a predetermined pressure, and deterioration of the gas barrier properties of the gas barrier thin film 92 after continuous film formation can be suppressed. The regeneration process for the heating element 18 is preferably carried out such that the heating element 18 is caused to generate heat after an oxidizing gas has been supplied. The oxidizing gas is preferably carbon dioxide. The regeneration process for the heating element 18 may be carried out every time the film-forming process is carried out, or may be carried out after the film-forming process is carried out several times. Furthermore, the regeneration process for the heating element 18 is preferably carried out after the film-forming process, after the plastic molded product has been removed from the vacuum chamber 6.

In the regeneration process for the heating element 18, the heating temperature of the heating element 18 is preferably from 1900° C. to 2500° C. The heating temperature is more preferably from 2000° C. to 2400° C. The heating time is preferably from 0.5 times to 3.0 times the duration of film formation. Furthermore, when the oxidizing gas that is added is carbon dioxide, the pressure inside the vacuum chamber in the regeneration process for the heating element 18 (hereinafter, also referred to as a vacuum pressure at the time of regeneration) during the regeneration process for the heating element 18 is preferably higher than or equal to 1.3 Pa and lower than 14 Pa. The pressure is more preferably from 1.4 Pa to 13 Pa. The vacuum pressure at the time of regeneration is preferably higher than 1 time and less than or equal to 9 times the partial pressure of the raw material gas 33 inside the vacuum chamber at the time of film formation (hereinafter, also referred to as the partial pressure of the raw material gas at the time of film formation). If the vacuum pressure at the time of regeneration is one time or less the partial pressure of the raw material gas at the time of film formation, the rate of accumulation of carbides exceeds the rate of removal, and when film formation is carried out continuously on plural molded bodies, the gas barrier properties of the films formed in the latter half may become poorer than the gas barrier properties of the films formed in the first half. Furthermore, if the vacuum pressure at the time of regeneration is higher than 9 times the partial pressure of the raw material gas at the time of film formation, in addition to the removal of carbides, oxidation of the surface of the heating element 18 occurs, and due to the incorporation of oxide components into the gas barrier thin film, or due to the consumption of the heating element 18 caused by evaporation, the gas barrier properties of the film formed in the latter half may deteriorate at the time of continuous film formation. Meanwhile, the supply route of the oxidizing gas into the vacuum chamber 6 during the regeneration process for the heating element 18 may be the same as the supply route for the raw material gas in the film-forming process, or may be a route different from the supply route for the raw material gas.

Next, the principle in which the gas barrier properties of the gas barrier thin film decrease when the film-forming process is repeated, and the effect of the regeneration process for the heating element 18 will be described by taking as an example the case in which the heating element was tantalum metal of a purity of 99.5% by mass, this was heated to 2000° C., and the film-forming process was repeatedly carried out continuously for 100 times. Here, the analysis of the surface of the heating element was carried out by observing the element composition at a depth of 1 μm from the surface of the heating element using a scanning electron microscope (manufactured by Hitachi, Ltd., SU1510), and by using an energy dispersive X-ray analyzer (manufactured by Horiba, Ltd., EMAX ENERGY) attached to the same apparatus. It was confirmed that while the element concentration of carbon was less than 1 at. % before film formation, the element concentration of carbon increased up to 50 at % at the maximum after repetition of the film-forming process continuously for 100 times. When this was normalized on a mass basis, the element concentration was less than 0.13% by mass before film formation, and the element concentration was 6.2% by mass at the maximum after repetition of the film-forming process continuously for 100 times. The electrical resistance of the carbides produced at the surface of the heating element is larger compared with the electrical resistance of tantalum metal that forms the core of the heating element. Therefore, when the surface of the heating element is carbonized, even if the surface is electrified, the temperature does not easily increase. Then, a temperature sufficient for the formation of the gas barrier thin film 92 cannot be secured, and a compact film having high gas barrier properties may not be obtained. When the voltage that is applied to the heating element 18 is increased, and the temperature increase is sufficiently applied even to the surface of the heating element, in the case of a PET bottle, a gas barrier thin film 92 capable of enhancing the gas barrier properties 10 times or more can be formed. However, in a mass production process, the control of adjusting the applied voltage according to the rapid change in electrical resistance at the surface of the heating element is complicated. Thus, by performing the regeneration process for the heating element 18, complicated control of the applied voltage becomes unnecessary, and even if the film-forming process is continuously carried out, a thin film having high gas barrier properties can be formed continuously.

Figure 3:
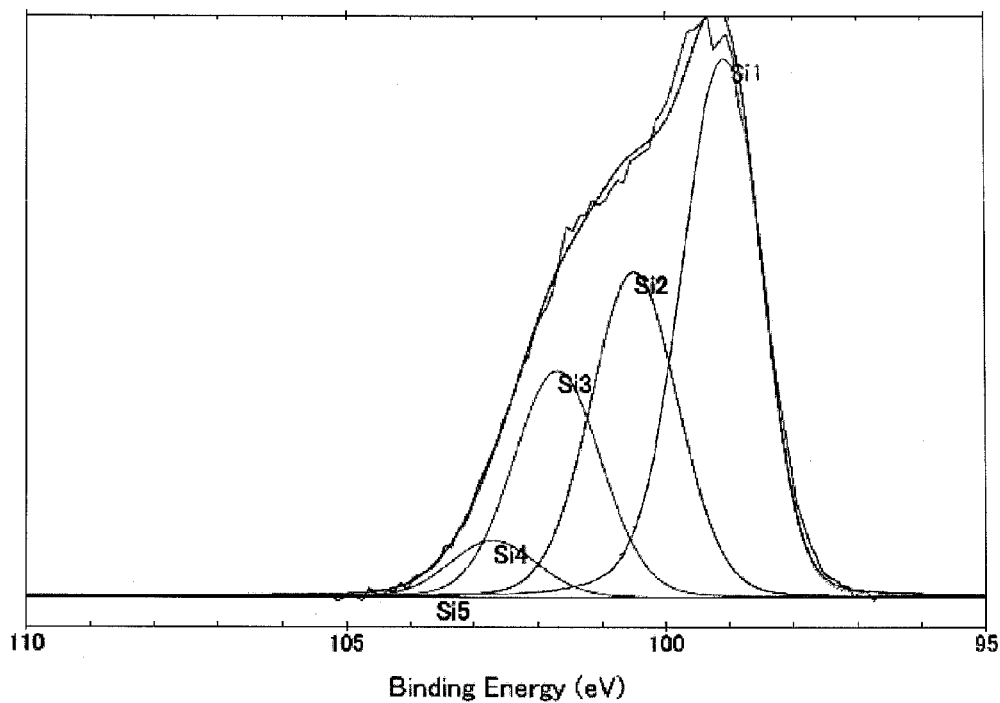
FIG. 3 is a diagram showing the peaks observed in the spectrum obtained by an XPS analysis of the thin film surface of Example 1 under the condition (1), while the peaks have been separated from the spectrum by a waveform analysis.

A method for forming a gas barrier thin film on the inner surface of a plastic container has been explained; however, in order to form a gas barrier thin film on the outer surface of a plastic container, the formation can be carried out using, for example, the film-forming apparatus illustrated in FIG. 3 of Patent Literature 4. Furthermore, the film-forming apparatus is not intended to be limited to the apparatus illustrated in FIG. 2, and various modifications can be made such as illustrated in, for example, Patent Literature 2 or 3.

An embodiment in which the plastic molded product is a plastic container has been explained, but the present invention is not intended to be limited to this, and a film or a sheet can be used as the plastic molded product.

EXAMPLES

Next, the present invention will be described in more detail by way of Examples, but the present invention is not construed to be limited to the Examples.

Example 1

A gas barrier thin film was formed on the inner surface of a 500-ml PET bottle (height: 133 mm, outer diameter of the cylinder: 64 mm, outer diameter of the opening: 24.9 mm, inner diameter of the opening: 21.4 mm, thickness: 300 μm, and resin amount; 29 g) as a plastic molded product, using the film-forming apparatus illustrated in FIG. 2. The PET bottle was accommodated in a vacuum chamber 6, and the pressure was reduced to 1.0 Pa. Subsequently, two molybdenum wires having a diameter of 0.5 mm and a length of 44 cm were used as heating element 18, and a direct current was applied to the heating element 18 at 24 V to cause the heating element to generate heat to 2000° C. Thereafter, vinylsilane as a raw material gas was supplied through the gas flow rate regulator 24a, while the valve aperture was adjusted, and thus, a gas barrier thin film was deposited on the inner surface of the PET bottle. Here, the piping from the gas flow rate regulator 24a to the gas supply port 16 was constructed with a ¼-inch pipe made of alumina, and the flow rate of the raw material gas was set to 50 sccm. The pressure (total pressure) at the time of film formation was adjusted to 1.4 Pa. The duration of film formation was set to 6 seconds. At this time, the partial pressure of vinylsilane (partial pressure of the raw material gas at the time of film formation) was the same as the pressure (total pressure) at the time of film formation, and was 1.4 Pa.

Example 2

A gas barrier plastic molded product was obtained according to Example 1, except that the direct current applied to the heating element 18 in Example 1 was adjusted, and thereby, the heat generation temperature was set to 1550° C.

Example 3

A gas barrier plastic molded product was obtained according to Example 1, except that the direct current applied to the heating element 18 in Example 1 was adjusted, and thereby, the heat generation temperature was set to 2200° C.

Example 4

A gas barrier plastic molded product was obtained according to Example 1, except that the raw material gas was changed from the vinylsilane used in Example 1 to 1,4-disilabutane. The duration of film formation was set to 6 seconds.

Example 5

A gas barrier plastic molded product was obtained according to Example 1, except that the raw material gas was changed from the vinylsilane used in Example 1 to disilylacetylene. The duration of film formation was set to 6 seconds.

Example 6

A gas barrier plastic molded product was obtained according to Example 1, except that the heating element 18 was changed from the molybdenum wires used in Example 1 to tungsten wires. The duration of film formation was set to 6 seconds.

Example 7

A gas barrier plastic molded product was obtained according to Example 1, except that the heating element 18 was changed from the molybdenum wires used in Example 1 to zirconium wires, the direct current applied to the heating element 18 was adjusted to set the heat generation temperature to 1700° C., and the duration of film formation was set to 6 seconds.

Example 8

A gas barrier plastic molded product was obtained according to Example 1, except that the heating element 18 was changed from the molybdenum wires used in Example 1 to tantalum wires.

Example 9

A gas barrier plastic molded product was obtained according to Example 1, except that the heating element 18 was changed from the molybdenum wires used in Example 1 to tantalum wires, and the duration of film formation was set to 8 seconds, while this was repeated 5 times.

Example 10

A thin film was formed on the surface of a plastic molded product according to Example 1, except that the heating element 18 was changed from the molybdenum wires used in Example 1 to tantalum carbide ($TaC_X$ (X=1, the mass ratio of carbon atoms in $TaC_X$ was 6.2% by mass, and the element concentration of carbon atoms in $TaC_X$ was 50 at. %)) wires, and the direct current applied to the heating element 18 was adjusted to set the heat generation temperature to 2400° C.

Example 11

A thin film was formed on the surface of a plastic molded product according to Example 1, except that the heating element 18 was changed from the molybdenum wires used in Example 1 to tungsten carbide ($WC_X$ (X=1, the mass ratio of carbon atoms in $WC_X$ was 6.1% by mass, and the element concentration of carbon atoms in $WC_X$ was 50 at. %)) wires, and the direct current applied to the heating element 18 was adjusted to set the heat generation temperature to 2400° C.

Comparative Example 1

A thin film was formed on the inner surface of a 500-ml PET bottle (height: 133 mm, outer diameter of the cylinder: 64 mm, outer diameter of the opening: 24.9 mm, inner diameter of the opening: 21.4 mm, thickness: 300 µm, and resin amount; 29 g) as a plastic molded product, using the production apparatus illustrated in FIG. 1 of Patent Literature 6. The PET bottle was accommodated inside the external electrode, and the pressure inside the external electrode was reduced to 5 Pa with a vacuum pump. Thereafter, vinylsilane as a raw material gas was supplied to the interior of the PET bottle through the raw material gas supply pipe while the flow rate was adjusted to 80 sccm. After the supply of the raw material gas, electric power was input from a high frequency power supply to the external electrode via a matching box, a high frequency voltage of 800 W and 13.5 MHz was applied between the external electrode and the internal electrode, and thereby plasma was generated. While plasma of the raw material gas had been generated, the PET bottle was retained for 2 seconds, and thus a thin film was formed on the inner surface of the PET bottle.

Comparative Example 2

A thin film was formed on the surface of a plastic molded product according to Example 1, except that the raw material gas was changed from the vinylsilane used in Example 1 to monomethylsilane. The duration of film formation was set to 6 seconds.

Comparative Example 3

A thin film was formed on the surface of a plastic molded product according to Example 1, except that the raw material gas was changed from the vinylsilane used in Example 1 to dimethylsilane. The duration of film formation was set to 6 seconds.

Comparative Example 4

A thin film was formed on the surface of a plastic molded product according to Example 1, except that the raw material gas was changed from the vinylsilane used in Example 1 to trimethylsilane. The duration of film formation was set to 6 seconds.

Comparative Example 5

A thin film was formed on the surface of a plastic molded product according to Example 1, except that the raw material gas was changed from the vinylsilane used in Example 1 to tetramethylsilane. The duration of film formation was set to 6 seconds.

Comparative Example 6

A thin film was formed on the surface of a plastic molded product according to Example 1, except that the raw material gas was changed from the vinylsilane used in Example 1 to dimethoxymethylvinylsilane. The duration of film formation was set to 6 seconds.

Comparative Example 7

A thin film was formed on the surface of a plastic molded product according to Example 1, except that the heating element 18 was changed from the molybdenum wires used in Example 1 to iridium wires. The duration of film formation was set to 6 seconds.

Comparative Example 8

A thin film was formed on the surface of a plastic molded product according to Example 1, except that the heating element 18 was changed from the molybdenum wires used in Example 1 to rhenium wires. The duration of film formation was set to 6 seconds.

Comparative Example 9

A thin film was formed on the surface of a plastic molded product according to Example 1, except that the heating element 18 was changed from the molybdenum wires used in Example 1 to platinum wires, and the heat generation temperature was set to 1500° C. by adjusting the direct current applied to the heating element 18. The duration of film formation was set to 6 seconds.

Comparative Example 10

A thin film was formed on the surface of a plastic molded product according to Example 1, except that the heating element 18 was changed from the molybdenum wires used in Example 1 to rhodium wires, and the heat generation temperature was set to 1500° C. by adjusting the direct current applied to the heating element 18. The duration of film formation was set to 6 seconds.

Comparative Example 11

A thin film was formed on the surface of a plastic molded product according to Example 1, except that the heating element 18 was changed from the molybdenum wires used in Example 1 to titanium wires, and the heat generation temperature was set to 1500° C. by adjusting the direct current applied to the heating element 18. The duration of film formation was set to 6 seconds.

Comparative Example 12

A thin film was formed on the surface of a plastic molded product according to Example 1, except that the heat generation temperature was set to 1500° C. by adjusting the direct current applied to the heating element 18. The duration of film formation required to adjust the film thickness of the thin film to 30 nm was 25 seconds.

The plastic molded products of Examples and Comparative Examples thus obtained, each including a gas barrier plastic molded product and a thin film, were subjected to an evaluation by the following methods. The evaluation results are presented in Tables 1 to 4.

TABLE 1

| | Element ratio at thin film surface | | |
|---|---|---|---|
| | Si | C | O |
| Example 1 | 44.3 | 45.5 | 10.2 |
| Example 2 | 40.1 | 24.1 | 35.8 |
| Example 3 | 55.7 | 39.2 | 5.1 |
| Example 4 | 47.0 | 34.2 | 18.8 |
| Example 5 | 40.7 | 45.4 | 13.9 |
| Example 6 | 43.2 | 44.6 | 12.2 |
| Example 7 | 41.1 | 22.8 | 36.1 |
| Example 8 | 53.7 | 44.3 | 2.0 |
| Example 10 | 48.2 | 46.9 | 4.9 |
| Example 11 | 40.9 | 46.9 | 12.2 |
| Comparative Example 1 | 28.7 | 45.3 | 26.0 |
| Comparative Example 2 | 31.3 | 41.0 | 27.7 |
| Comparative Example 3 | 27.1 | 41.0 | 31.9 |
| Comparative Example 4 | 29.9 | 43.6 | 26.5 |
| Comparative Example 6 | 22.5 | 37.5 | 40.0 |

TABLE 2

| | Element ratio of thin film | | | |
|---|---|---|---|---|
| | Si | C | O | H |
| Example 1 | 25.4 | 18.5 | 14.9 | 41.2 |
| Example 2 | 21.5 | 12.9 | 19.1 | 46.5 |
| Example 3 | 42.1 | 29.7 | 3.9 | 24.3 |
| Example 4 | 25.0 | 18.4 | 10.4 | 46.2 |
| Example 5 | 31.8 | 35.5 | 10.9 | 21.8 |
| Example 6 | 25.7 | 26.5 | 7.3 | 40.5 |
| Example 7 | 27.5 | 15.3 | 24.1 | 33.1 |
| Example 8 | 36.2 | 29.9 | 1.3 | 32.6 |

TABLE 3

| | Film thickness [nm] | Oxygen permeability [cc/container/day] | BIF |
|---|---|---|---|
| Example 1 | 30 | 0.0016 | 22.0 |
| Example 2 | 30 | 0.0058 | 6.0 |
| Example 3 | 30 | 0.0016 | 22.0 |
| Example 4 | 30 | 0.0016 | 22.0 |
| Example 5 | 26 | 0.0018 | 20.0 |
| Example 6 | 30 | 0.0035 | 10.0 |
| Example 7 | 20 | 0.0015 | 24.0 |
| Example 8 | 30 | 0.0025 | 14.0 |
| Example 9 | 197 | 0.0008 | 43.8 |
| Example 10 | 30 | 0.0024 | 14.6 |
| Example 11 | 30 | 0.0028 | 12.5 |
| Comparative Example 1 | 30 | 0.0218 | 1.5 |
| Comparative Example 2 | 30 | 0.0250 | 1.4 |
| Comparative Example 3 | 30 | 0.0350 | 1.0 |
| Comparative Example 4 | 30 | 0.0318 | 1.1 |
| Comparative Example 5 | 10 | 0.0355 | 1.0 |
| Comparative Example 6 | 30 | 0.0346 | 1.0 |
| Comparative Example 7 | <3 | 0.0348 | 1.0 |
| Comparative Example 8 | 30 | 0.0320 | 1.1 |
| Comparative Example 9 | <3 | 0.0344 | 1.0 |
| Comparative Example 10 | <3 | 0.0356 | 1.0 |
| Comparative Example 11 | <3 | 0.0351 | 1.0 |
| Comparative Example 12 | 30 | 0.0343 | 1.0 |
| Bottle without film formed therein | 0 | 0.0350 | 1.0 |

TABLE 4

| | Concentration of aqueous solution of K$_2$CO$_3$ | | | | | | | | | | | | | | | | | Comprehensive judgment Density range (g/cm$^3$) |
|---|---|---|---|---|---|---|---|---|---|---|---|---|---|---|---|---|---|---|
| | 29 | 30 | 31 | 32 | 33 | 34 | 35 | 36 | 37 | 38 | 39 | 40 | 41 | 42 | 43 | 44 | 45 | |
| Example 1 | ○ | ○ | Δ | Δ | Δ | Δ | Δ | Δ | Δ | Δ | Δ | Δ | Δ | Δ | Δ | X | X | 1.315~1.450 |
| Example 4 | ○ | Δ | Δ | Δ | Δ | Δ | Δ | Δ | Δ | Δ | Δ | Δ | Δ | Δ | X | X | X | 1.304~1.439 |
| Example 5 | ○ | ○ | Δ | Δ | Δ | Δ | Δ | Δ | Δ | Δ | Δ | Δ | Δ | Δ | Δ | Δ | X | 1.315~1.461 |
| Solution density (g/cm$^{-1}$) | 1.293 | 1.304 | 1.315 | 1.327 | 1.338 | 1.349 | 1.360 | 1.371 | 1.383 | 1.394 | 1.405 | 1.416 | 1.427 | 1.439 | 1.450 | 1.461 | 1.472 | |

X: Film fragments sank down on the bottom floor.
Δ: Film fragments were floating.
○: Film fragments floated on the water surface.

(XPS Analysis)

The surfaces of the thin films formed in Examples 1 to 8, 10 and 11, and Comparative Examples 1 to 4 and 6 were analyzed using an XPS apparatus (type: QUANTERASXM, manufactured by ULVAC-PHI, Inc.). The ratios of constituent elements at the thin film surfaces are presented in Table 1. The conditions for the XPS analysis were as follows.

Figure 4:
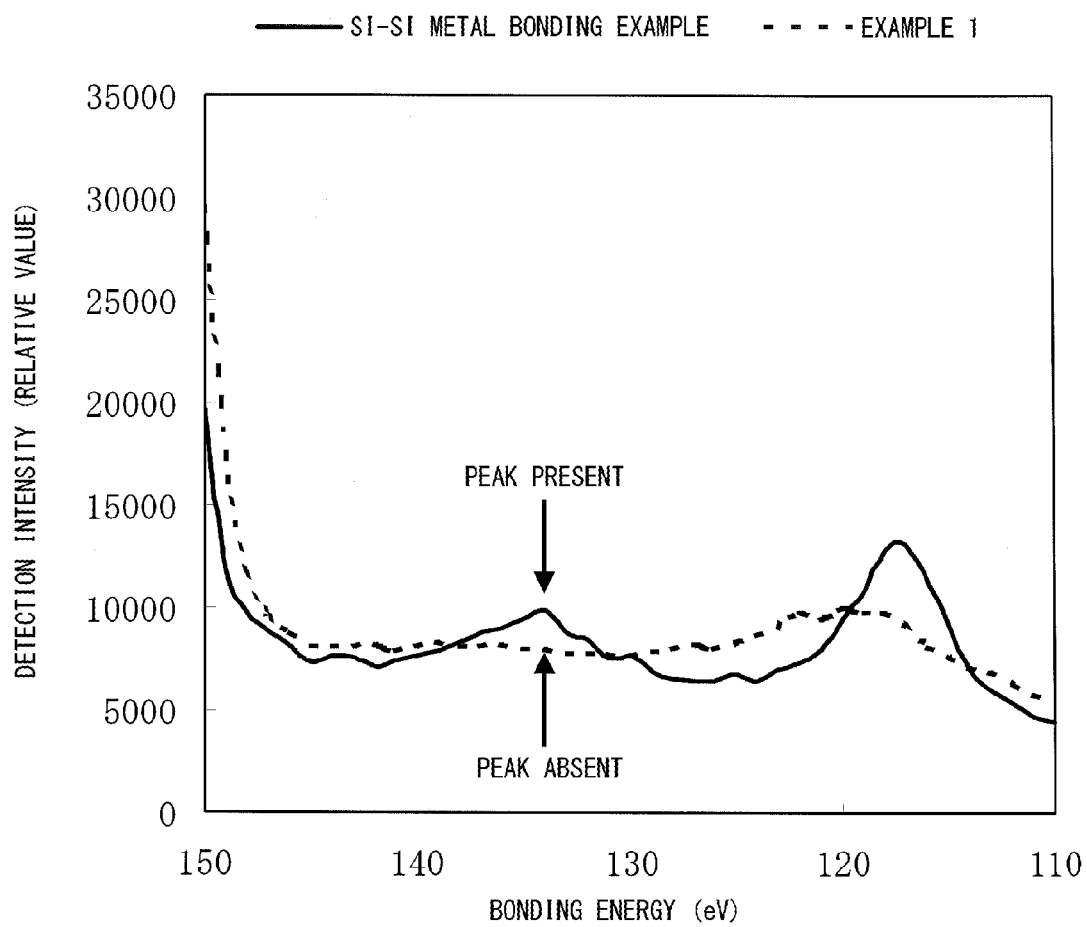
FIG. 4 is a diagram showing the spectrum obtained by an XPS analysis of the thin film surface of Example 1 under the condition (2).
Figure 5:
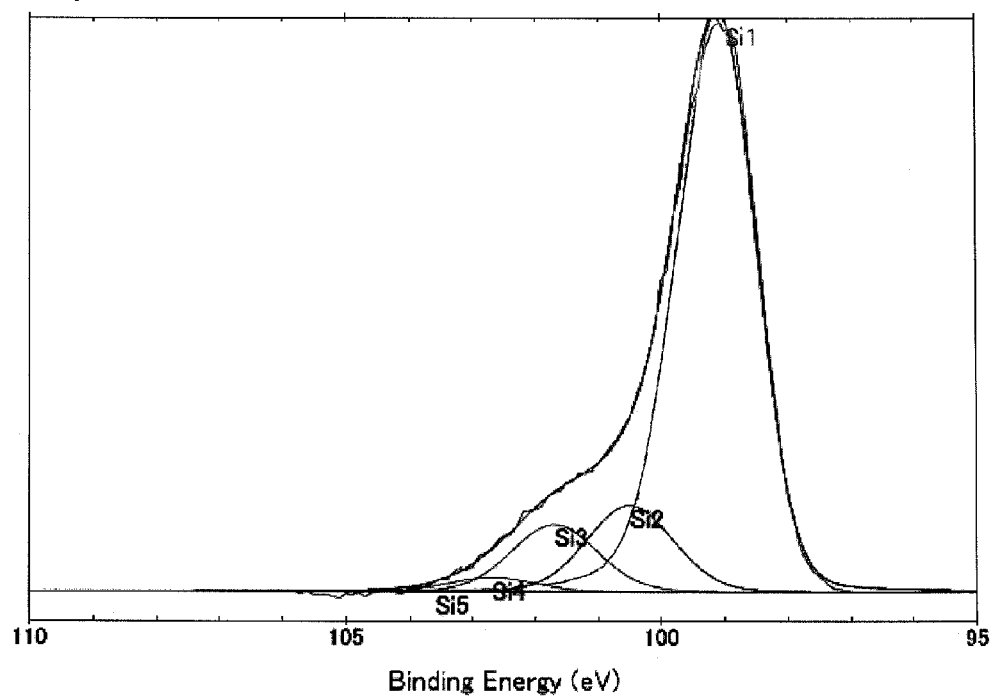
FIG. 5 is a diagram showing the peaks observed in the spectrum obtained by an XPS analysis of the thin film surface of Example 4 under the condition (1), while the peaks have been separated from the spectrum by a waveform analysis.
Figure 6:
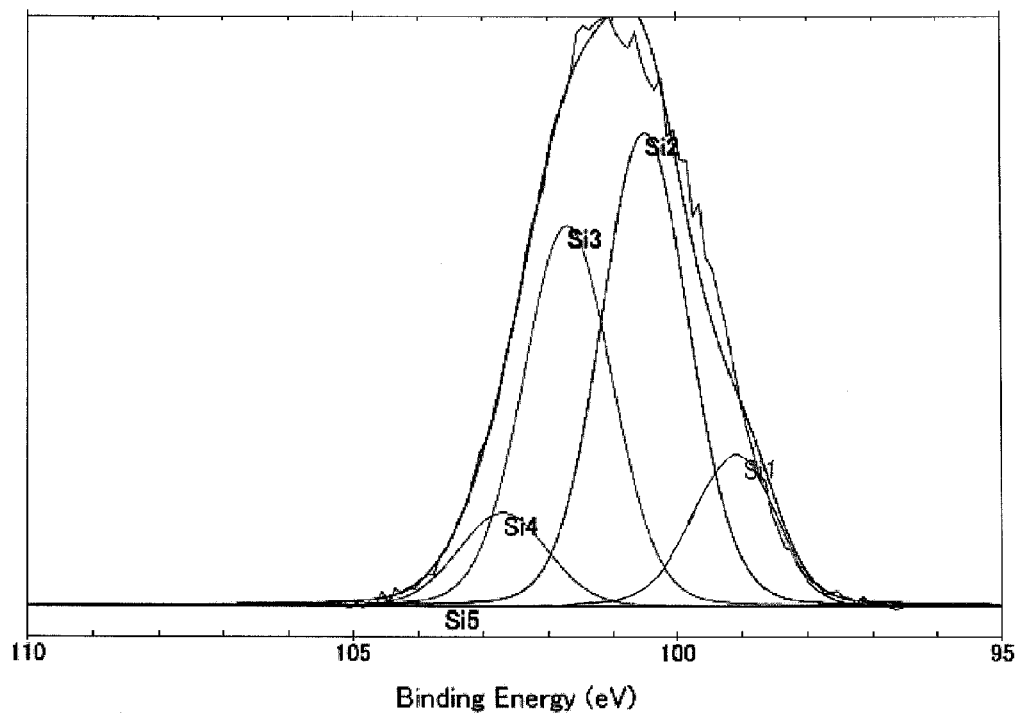
FIG. 6 is a diagram showing the peaks observed in the spectrum obtained by an XPS analysis of the thin film surface of Comparative Example 2 under the condition (1), while the peaks have been separated from the spectrum by a waveform analysis.

X-ray source: Monochromatized Al (1486.6 eV)
Detection region: 100 μmφ
Sputtering condition: Ar+1.0 kV FIG. 3 is a diagram showing the peaks observed in the spectrum obtained by an XPS analysis of the thin film surface of Example 1 under the condition (1), with the peaks observed being separated from the spectrum by a waveform analysis. FIG. 4 is a diagram showing the spectrum obtained by an XPS analysis of the thin film surface of Example 1 under the condition (2). FIG. 5 is a diagram showing the peaks observed in the spectrum obtained by an XPS analysis of the thin film surface of Example 4 under the condition (1), with the peaks being separated from the spectrum by a waveform analysis. FIG. 6 is a diagram showing the peaks observed in the spectrum obtained by an XPS analysis of the thin film surface of Comparative Example 2 under the condition (1), with the peaks being separated from the spectrum by a waveform analysis. Meanwhile, in FIG. 3, FIG. 5 and FIG. 6, the bonding state contemplated by the waveform analyses was such that Si1: Si peak (Si—Si bond or Si—H bond), Si2: SiC, SiO$_1$C$_3$, Si$_2$O, Si3: SiO$_2$C$_2$, SiO, Si4: SiO$_3$C$_1$, Si$_2$O$_3$, and Si5: SiO$_2$.

In Example 1, as illustrated in FIG. 3, a peak was observed at the peak appearance position of the bonding energy between Si and Si under the condition (1), while as illustrated in FIG. 4, no peak was observed at the peak appearance position of the bonding energy between Si and Si under the condition (2). From this, it is speculated that the thin film of Example 1 has a Si—H bond. Meanwhile, the same peak was also obtained in other Examples. Furthermore, from FIG. 3, it was confirmed in regard to the peaks of Example 1 that Si1 (Si peak) was the main peak. As illustrated in FIG. 5, it was also confirmed in regard to Example 4 that Si1 (Si peak) was the main peak.

On the other hand, in Comparative Example 2, as illustrated in FIG. 6, no peak was observed at the peak appearance position of the bonding energy between Si and Si under the condition (1), and a peak was observed at the peak appearance position of SiC, SiOC, SiO or SiO$_2$. Furthermore, from FIG. 6, it was confirmed in regard to the peaks of Comparative Example 2 that Si3 was the main peak. In addition, Comparative Examples 1 and 3 to 8 also did not have Si1, and the main peak was Si2 in Comparative Example 1, Si3 in Comparative Examples 3 to 6, and Si5 in Comparative Examples 7 to 11.

(Element Ratio of Thin Film by RBS Analysis)

The thin films formed in Examples 1 to 8 were analyzed using a high resolution RBS apparatus (type: HRBS500, manufactured by Kobe Steel, Ltd.). The ratio of the constituent elements of the thin film is presented in Table 2.

(Film Thickness)

The film thickness is a value measured using a probe type step gauge (type: α-step, manufactured by KLA-Tencor Corp.). The evaluation results are presented in Table 3.

(Oxygen Permeability)

The oxygen permeability was measured using an oxygen permeability measuring apparatus (type: OXTRAN 2/20, manufactured by Modern Controls, Inc.) under the conditions of 23° C. and 90% RH, conditioning was carried out for 24 hours from the initiation of measurement, and the oxygen permeability was designated as the value obtained after the passage of 72 hours from the initiation of measurement. For reference, the oxygen permeability of the PET bottle before the formation of a thin film was measured, and this value is indicated in the table in the column for Bottle without film formed therein. The evaluation results are presented in Table 3.

(BIF)

The BIF was calculated by taking, in connection with Mathematical Formula 4, the value of oxygen permeability of the PET bottle without a thin film formed therein as the oxygen permeability of a plastic molded product without a thin film formed therein, and taking the value of oxygen permeability of the plastic container obtained in the Examples or the Comparative Examples as the oxygen permeability of a gas barrier plastic molded product. The evaluation results are presented in Table 3.

(Film Density)

In regard to the film density, film fragments were stirred in 100 ml each of aqueous solutions of potassium carbonate at various concentrations, and the state of floating and sinking after 15 minutes was visually observed. For the film fragments, the ink of a commercially available oil marker was applied inside a PET bottle, and a film was formed thereon to a film thickness of 50 μm according to the conditions of Examples 1, 4 and 5. Subsequently, film fragments were taken out from the PET bottle using cotton swabs that were soaked with ethanol. Film fragments floating on the water surface of the aqueous solution of potassium carbonate were judged to have a density smaller (○) than the density of the relevant aqueous solution, and film fragments that sank down on the bottom floor of the aqueous solution of potassium carbonate were judged to have a density larger (X) than the density of the relevant aqueous solution. Film fragments that were floating between the water surface of the aqueous solution of potassium carbonate and the bottom floor were judged to have a density equal (Δ) to the density of the relevant aqueous solution, and the range of Δ judgment was designated as the range of density. The density and evaluation results obtained at various concentrations are presented in Table 4.

As can be seen from Table 1 to Table 3, it was confirmed that since the gas barrier thin films of Example 1 to Example 11 had a Si—H bond in the thin film, and had a Si-containing layer having a Si content percentage of 40.1% or more, thin films having high gas barrier properties with a small value of oxygen permeability and a BIF value of 6 or greater could be formed with a single kind of raw material gas.

On the other hand, in Comparative Example 1, since a thin film was formed by a plasma CVD method, the Si content percentage in the thin film was low, and the gas barrier properties were poor. In Comparative Examples where a gas other than the compound of formula (Chemical Formula 1) was used as the raw material gas, the Si content percentage in the thin film was low, and the gas barrier properties were poor. In Comparative Examples 7 to 11, since a material other than Mo, W, Zr, Ta, V, Nb or Hf was used as the heating element, the film-forming efficiency was poor, and the gas barrier properties were poor. In Comparative Example 12, since the heat generation temperature of the heating element was low, the film-forming efficiency was poor, and the gas barrier properties were poor.

Next, a test for verifying the effect of the regeneration process for the heating element was carried out.

Example 12

A film-forming process was carried out 100 times according to Example 8, and after completion of every one round of the film-forming process, the regeneration process for the heating element was carried out. In each regeneration process, at the time point where the pressure inside the vacuum chamber 6 reached a vacuum pressure of 1.0 Pa, $CO_2$ as the oxidizing gas was supplied to the vacuum chamber 6, and thereby the vacuum pressure was adjusted to 12.5 Pa (a vacuum pressure equivalent to 9 times the partial pressure, 1.4 Pa, of the raw material gas at the time of film formation), while the heating element 18 was heated to 2000° C. for 6 seconds.

Example 13

The film-forming process was carried out 100 times according to Example 8, and after completion of every 10 rounds of the film-forming process, the regeneration process for the heating element was carried out. Each regeneration process was carried out under the same conditions as in Example 12, except that the time for heating the heating element 18 was adjusted to 60 seconds.

Example 14

The film-forming process was carried out 100 times according to Example 10, and after completion of every one round of the film-forming process, the regeneration process for the heating element was carried out. Each regeneration process was carried out under the same conditions as in Example 12.

Example 15

The film-forming process was carried out 100 times according to Example 10, and after completion of every 10 rounds of the film-forming process, the regeneration process for the heating element was carried out. Each regeneration process was carried out under the same conditions as in Example 13.

Example 16

The regeneration process for the heating element was carried out under the same conditions as in Example 12, except that on the contrary to Example 12, $CO_2$ was supplied to the vacuum chamber 6 to adjust the vacuum pressure to 1.4 Pa (a vacuum pressure equivalent to 1.0 time of the partial pressure, 1.4 Pa, of the raw material gas at the time of film formation).

Example 17

The regeneration process for the heating element was carried out under the same conditions as in Example 12, except that on the contrary to Example 12, $CO_2$ was supplied to the vacuum chamber 6 to adjust the vacuum pressure to 1.3 Pa (a vacuum pressure equivalent to 0.93 times of the partial pressure, 1.4 Pa, of the raw material gas at the time of film formation).

Reference Example 1

The regeneration process for the heating element was carried out under the same conditions as in Example 12, except that on the contrary to Example 12, $CO_2$ was supplied to the vacuum chamber 6 to adjust the vacuum pressure to 14.0 Pa (a vacuum pressure equivalent to 10 times of the partial pressure, 1.4 Pa, of the raw material gas at the time of film formation).

Reference Example 2

The film-forming process was carried out 100 times according to Example 8, but the regeneration process for the heating element was not carried out.

Reference Example 3

The film-forming process was carried out 100 times according to Example 10, but the regeneration process for the heating element was not carried out.

(BIF Measurement)

Figure 7:
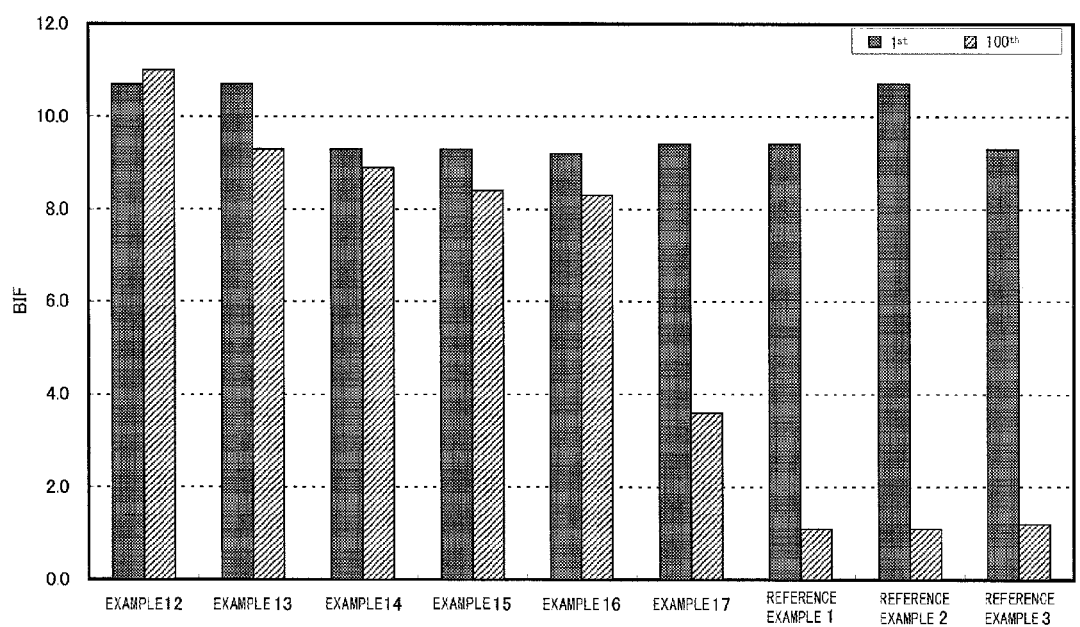
FIG. 7 is a diagram in which film formation exhibits the first and $100^{th}$ BIF values in a test for confirming a process for regenerating a heating element.

In Example 20 to Example 25, and Reference Example 1 to Reference Example 3, the first and $100^{th}$ BIF values of film formation were respectively measured. The measurement method for BIF was carried out by the method described in section "Evaluation of gas barrier properties—BIF". The determination criteria for the evaluation of gas barrier properties are as follows. The measurement results for BIF are presented in FIG. 7.

Determination criteria for the evaluation of gas barrier properties:

The BIF value is 8 or greater: A level suitable for practical use

The BIF value is greater than or equal to 5 and less than 8: A level suitable for practical use The BIF value is greater than or equal to 2 and less than 5: A lower limit level suitable for practical use The BIF value is less than 2: A level inappropriate for practical use As can be seen from FIG. 7, in all of Example 12 to Example 17, both the first and $100^{th}$ BIF values were at a level suitable for practical use. Particularly, in all of Example 12 to Example 16, there was no significant difference in the gas barrier properties between the first film-forming process and the 100$^{th}$ film-forming process, and the 100$^{th}$ BIF value was 8 or higher. In Example 17, since the vacuum pressure at the time of regeneration was lower than the vacuum pressure inside the vacuum chamber at the time of film formation, although the 100$^{th}$ BIF value was 3.6, the gas barrier properties were maintained at a level suitable for practical use. In contrast to this, in Reference Example 1 to Reference Example 3, although the gas barrier properties were satisfactory in the first film-forming process, the gas barrier properties significantly deteriorated in the 100$^{th}$ film-forming process. In Reference Example 1, it is speculated that although the regeneration process was carried out, since the vacuum pressure at the time of regeneration was too high, the surface of the heating element was oxidized, and thereby the gas barrier properties were deteriorated after continuous film formation. From the above, it could be confirmed that the suitability to continuous film formation was improved by performing the regeneration process.

INDUSTRIAL APPLICABILITY

The gas barrier plastic molded product according to the present invention is suitable as a packaging material. Furthermore, a gas barrier container formed from the gas barrier plastic molded product according to the present invention is suitable as a container for beverages such as water, tea beverages, soft drinks, carbonated beverages, and fruit juice beverages.

REFERENCE SIGNS LIST

6 Vacuum chamber
8 Vacuum valve
11 Plastic container
12 Reaction chamber
13 Lower chamber
14 O-ring
15 Upper chamber
16 Gas supply port
17 Raw material gas flow channel
17x Gas outlet port
18 Heating element
19 Wire
20 Heater power supply
21 Opening of plastic container
22 Exhaust pipe
23 Raw material gas supply pipe
24a, 24b Flow rate regulators
25a, 25b, 25c Valves
26a, 26b Connection areas
27 Cooling water flow channel
28 Inner surface of vacuum chamber
29 Cooling unit
30 Chamber formed from a transparent body
33 Raw material gas
34 Chemical species
35 Insulating ceramic member
40a, 40b Raw material tanks
41a, 41b Starting raw materials
90 Gas barrier plastic molded product
91 Plastic molded product
92 Gas barrier thin film
100 Film-forming apparatus

The invention claimed is:

1. A gas barrier plastic molded product comprising a plastic molded product and a gas barrier thin film provided on the surface of the plastic molded product, in which the gas barrier thin film contains silicon (Si), carbon (C), oxygen (O) and hydrogen (H) as constituent elements, and comprises a Si-containing layer having a Si content percentage represented by (Mathematical Formula 1) of 40.1% or more:

Si content percentage [%]={(Si content [atomic %])/ (total content of Si, O and C [atomic %])}×100     (Mathematical Formula 1)

wherein in Mathematical Formula 1, the content of Si, O or C is a content thereof in the items of the three elements of Si, O and C.

2. The gas barrier plastic molded product according to claim 1, wherein the C content percentage represented by (Mathematical Formula 2) in the Si-containing layer is 22.8% to 45.5%:

C content percentage [%]={(C content [atomic %])/ (total content of Si, O and C [atomic %])}×100     (Mathematical Formula 2)

wherein in Mathematical Formula 2 , the content of Si, O or C is a content thereof in the items of the three elements of Si, O and C.

3. The gas barrier plastic molded product according to claim 1, wherein the O content percentage represented by (Mathematical Formula 3) in the Si-containing layer is 2.0% to 35.8%:

O content percentage [%]={(O content [atomic %])/ (total content of Si, O and C [atomic %])}×100     (Mathematical Formula 3)

wherein in Mathematical Formula 3, the content of Si, O or C is a content thereof in the items of the three elements of Si, O and C.

4. The gas barrier plastic molded product according to claim 1, wherein the hydrogen content percentage in the Si-containing layer is 21 atomic % to 46 atomic %.

5. The gas barrier plastic molded product according to claim 1, wherein the density of the gas barrier thin film is 1.30 g/cm$^3$ to 1.47 g/cm$^3$.

6. The gas barrier plastic molded product according to claim 1, wherein when the Si-containing layer is subjected to an X-ray photoelectron spectroscopic analysis under condition (1), the spectrum contains a region where a main peak is observed, at the peak appearance position of the bonding energy between Si and Si:
Condition (1): The measurement range is set to 95 eV to 105 eV.

7. The gas barrier plastic molded product according to claim 1, wherein when the Si-containing layer is subjected to an X-ray photoelectron spectroscopic analysis under condition (2), no peak is observed at the peak appearance position of the bonding energy between Si and Si:
Condition (2): The measurement range is set to 120 eV to 150 eV.

8. The gas barrier plastic molded product according to claim 1, wherein the gas barrier thin film is formed by a heating element CVD method.

9. The gas barrier plastic molded product according to claim 1, wherein the film thickness of the gas barrier thin film is 5 nm or larger.

10. The gas barrier plastic molded product according to claim 1, wherein the plastic molded product is a container, a film, or a sheet.

11. A method for producing a gas barrier plastic molded product, the method comprising a film-forming process of forming a gas barrier thin film by bringing a raw material gas into contact with a heating element that has generated heat, decomposing the raw material gas to produce a chemical species, and causing the chemical species to arrive at the surface of the plastic molded product, wherein an organosilane-based compound represented by formula (Chemical Formula 1) is used as the raw material gas, wherein the organosilane-based compound is vinylsilane, disilylacetylene, or 2-aminoethylsilane, a material containing one or two or more metal elements selected from the group consisting of Mo, W, Zr, Ta, V, Nb and Hf is used as the heating element, and the heat generation temperature of the heating element is set to 1550° C. to 2400° C.:

$$H_3Si-Cn-X \qquad \text{(Chemical Formula 1)}$$

wherein in Chemical Formula 1, n represents 2 or 3; and X represents $SiH_3$, H, or $NH_2$.

12. The method for producing a gas barrier plastic molded product according to claim 11, wherein as the heating element, tantalum metal, a tantalum-based alloy, or tantalum carbide is used; tungsten metal, a tungsten-based alloy, or tungsten carbide is used; molybdenum metal, a molybdenum-based alloy, or molybdenum carbide is used; or hafnium metal, a hafnium-based alloy, or hafnium carbide is used.

* * * * *